United States Patent [19]
LeClair et al.

[11] Patent Number: 5,485,390
[45] Date of Patent: Jan. 16, 1996

[54] INDUCTIVE-DEDUCTIVE PROCESS DESIGN FOR MACHINED PARTS

[75] Inventors: Steven R. LeClair, Spring Valley; Yoh-han Pao, Cleveland Heights, both of Ohio; Timothy E. Westhoven, Huntington Beach, Calif.; Hilmi N. Al-Kamhawi, Columbus, Ohio; C. L. Philip Chen; Allen G. Jackson, both of Kettering, Ohio; Adel C. Chemaly, Cincinnati, Ohio

[73] Assignee: The United States of America as represented by the Secrectary of the Air Force, Washington, D.C.

[21] Appl. No.: 159,968

[22] Filed: Nov. 30, 1993

[51] Int. Cl.$^6$ .................................................. G06F 19/00
[52] U.S. Cl. ...................................... 364/474.24; 395/904
[58] Field of Search ........................ 364/474.24, 474.05, 364/474.18, 474.29; 395/13; 6/904

[56] References Cited

U.S. PATENT DOCUMENTS

| | | | |
|---|---|---|---|
| 5,204,936 | 4/1993 | Kaneko et al. | 395/11 |
| 5,257,203 | 10/1993 | Riley et al. | 364/474.05 |
| 5,268,999 | 12/1993 | Yokoyama | 395/141 |
| 5,272,642 | 12/1993 | Suzuki | 364/474.24 |
| 5,297,054 | 3/1994 | Kienzle et al. | 364/474.24 |

OTHER PUBLICATIONS

Timothy E. Westhoven, *Feature Sequence In Process Planning Using The Episodal Associative Memory*, Thesis Submitted to Wright State Univ.

Westhoven et al., "Episodal Assoc. Memory For Sequencing Interactive Features In Process Planning."Butterworth–Heinemann Ltd London, UK, 1993, (in press).

Pao, Komeyli, Goraya, & LeClair, A Computer–Based Adaptive Associative Memory in Support of the Design and Planning, *International Journal of Applied Artificial Intelligence*, Hemisphere Publishing Company, Corp. N.Y., N.Y. (in press).

Pao, Komeyli, Shei, LeClair, & Winn, The Episodal Associative Memory: Managing Manufacturing Information on the Basis of Simularity and Associativity, *Journal of Intelligent Manufacturing* on Neural Networks, Chapman & Hall, Ltd. Publishers, N.Y., N.Y., vol. 4, No. 1, Feb. 1993, pp. 23–32.

(List continued on next page.)

*Primary Examiner*—Paul P. Gordon
*Attorney, Agent, or Firm*—Bernard E. Franz; Thomas L. Kundert

[57] ABSTRACT

In the design of the process to machine discrete mechanical parts, the sequence of removing material is arrived at to ensure that the resulting part is of the correct geometry and finish, and the process is safe, feasible and accomplished in minimum time. For complex parts, an experienced machinist makes use of inductive methods to relate similar part material, geometries together with interdependencies and their associated machining sequences which have produced quality parts in the past with minimum time expended, or deductive methods to generate a sequence by relating feature attributes (relative size and position) and relations (intersections and common tooling). Of interest is the interaction between the two methods because their coupling enables a self-improving design system to be realized. A feature-based solid modelling software environment provides the elements of a symbolic language for describing a discrete mechanical part in terms of its product and process design. The language is based on the use of features which the designer and/or machinist uses to associate and reason about the part and interaction between the machine, tool, fixture and starting raw stock for the various process design options involving the milling and drilling sequence for removing material. The machinist can either recall from experience, past designs contained in an associative memory, and/or activate generalized rules or constraints in a deductive memory to provide a feasible 'good' design. As additional non-geometric features (tolerance, surface finish and material properties) are provided both feature and operation sequencing are refined.

6 Claims, 20 Drawing Sheets

OTHER PUBLICATIONS

Westhoven, Chen, Pao, & LeClair, Episodal Associative Memory Approach for Sequencing Interactive Features in Process Planning, *Artificial Intelligence for Engineering Design, Analysis and Manufacturing,* Harcourt Brace Jovanovich Publishers, New York, N.Y., vol. 6 No. 4, Dec. 1992, pp. 177–197.

Westhoven, *Feature Sequencing in Process Planning Using an Episodal Associative Memory,* Master's Thesis, Wright State University, Dayton, Ohio, Nov. 1991, (Unpublished until cataloged in Wright State Library as of Feb., 1994).

Safety primary criteria

Speed primary criteria

Example Results

| Run | Interaction Matrices | | | Features | | | Certainty |
|---|---|---|---|---|---|---|---|
| 1 | 1-2 | 1-3 | 2-3 | 1 | 4 | 7 | 9/20 |
| 2 | 1-2 | 1-3 | 2-3 | 1 | 4 | - | 31/40 |
| 3 | 1-2 | 1-3 | 2-3 | 1 | - | - | 1/5 |
| 4 | 1-2 | 1-3 | 2-3 | 4 | - | - | 1/4 |
| 5 | 1-2 | 1-3 | 2-3 | 7 | - | - | 11/40 |
| 6 | 1-2 | 1-3 | 2-3 | 4 | 7 | - | 7/10 |
| 7 | 1-2 | 1-3 | 2-3 | 1 | 7 | - | 31/40 |
| 8 | 1-2 | 1-3 | 2-3 | - | - | - | 7/40 | inter = set intersection operation

INDUCTIVE-DEDUCTIVE PROCESS DESIGN FOR MACHINED PARTS

RIGHTS OF THE GOVERNMENT

The invention described herein may be manufactured and used by or for the Government of the United States for all governmental purposes without the payment of any royalty.

APPENDIX

This application includes an appendix comprising computer source code listings, in which the total number of pages is 23.

BACKGROUND OF THE INVENTION

The present invention relates generally to an Inductive-Deductive Process Design for Machined Parts.

In the machining of discrete mechanical parts using milling and drilling operations, four levels of process design must be addressed: Level 1 is the grouping o features into setups to be sequenced to machine (rough and finish) the part design, Level 2 is the selection of fixtures needed to position and secure the starting stock of material during a setup, Level 3 is the sequencing of shape features and Level 4 is the sequencing of operations across features within a set up.

For such complex geometries, an experienced machinist/process designer can, nevertheless, come up with a suitable design by evaluating alternative process designs. The machinist/process designer recursively iterates on the selection of fixturing, setup and feature sequencing alternatives until a process design is selected. The proper design and fabrication of such a process is a difficult enterprise normally undertaken only by highly experienced machinists/process designers, especially if the part geometry is truly complex.

A metal part, regardless of the shape complexity and forming process, typically requires some material removal or finishing process involving drilling or milling, i.e., machining. Although machining processes are separate and distinct from the other process steps, they are highly dependent on pre and post processes such as forging and casting or plating, heat treating, grinding and inspection. Because of the amount of time associated with machining a part (i.e., hours or even days), the process is often viewed as a discrete versus a continuous problem. The discrete nature of the problem does not easily lend itself to solution via a mathematical expression although various dynamic, branch and bound, and linear programming techniques have been employed in the past. Typically these techniques attempt to simplify the problem to conform to their computational limitations and very often are not utilized in practice.

An optimal process design for a particular part may be 40 hours and the next best design may be 100 hours, depending on alternative setups, fixtures, cutting tools and machines. The difference is very often dependent on the experience of the machinist in either recalling the process design of a similar part in the past or associating general constraints which apply to this particular part design and enable the generation of a new process design, together with the associated selection of fixtures, setups, machines and tools. Although various programming techniques can help organize the problem, the various and competing interdependencies (e.g., minimum tool changes, minimum setups, minimum machine travel distance combined with overriding safety and quality constraints) between variables severely limits these other techniques.

Other than manual trial and error as practiced by the machinist/process designers today, to our knowledge there exists no prior means to self-improve process design for machining. Although various group technology process planning systems (both generative and variant) and recent 'disassembly' algorithms automate aspects of process design for machining, none of them are capable of multi-objective optimization of setups, fixtures, features and operations involving material, geometric and processing resource constraints.

SUMMARY OF THE INVENTION

An objective of the invention is to provide a memory-driven, feature-based engineering design system for designing material removal sequences in,the machining of discrete mechanical parts. A general objective is to enable a self-improving capability in the context of product-process design which is applicable to all materials and processes. A specific objective is the automating of process design for machined parts (potential savings in time and cost is dependent of the complexity of the part but typical savings are 40–200 hours/part design at a cost of $20.00/hr.).

In this approach, a feature-based solid modelling CAD system provides an environment in which a designer and/or machinist can visualize the fabrication of a part by 1) categorizing constituent shape information into features and 2) using those categories as a basis for sequencing the removal of material from the starting raw stock. The designer/machinist can recall from experience similar parts (comprised of the same or similar features) contained in an associative memory for insights regarding how best to optimize the machining sequence, Or use an evolutionary program to generate a feasible design as constrained by a set of rules. In either case, the design system is capable of generating part of or a complete process design to machine the part.

Beyond the autonomous generation of a partial or complete design, the intended purpose of the features and memory approach is to enable a self-improving process design system. The ability of the system to self-improve will be effected in three (3) separate methods (referenced in FIG. 2): Method #1—immediate and incremental adaptation of weights assigned to rules/constraints in what is referred to as a cognitive memory, Method #2—performance monitoring and classification of Genetic Algorithms with particular design problems, Method #3—coupling to an associative memory which clusters similar design problems and uses supervised earning neural networks/Genetic Algorithms and rough sets to discover concepts: mappings of input variables to output solutions.

Advantages and New Features

1. An Inductive-Deductive Coupling Architecture and Method to enable a self-improving and therefore a self-maintaining process design system. The application is the sequencing of material removal setups, features and operations but the method is applicable to any process design problem which involves both material, geometric and/or resource constraints.

2. A Weighted Constraints Representation Method (in Cognitive Memory) to 1) adapt the relevance of constraints to design problems and 2) compete material, process resource and geometric constraints associated with an engineering design problem.

3. An Adaptive Evolutionary Programming Technique (in Cognitive Memory) for optimizing process designs for material removal: setup, feature and operation sequences. These Adaptive Evolutionary Program are Genetic Algorithms which incorporate acquired characteristics, i.e., heuristics to guide their search for an optimal or near-optimal process design.

4. A Self-Organized Setup Generation Technique (in Cognitive Memory) to automatically cluster design features into groups which establish an initial number of setups for positioning the mechanical part for material removal.

5. A Concept Generation Technique (in Inductive Memory) to identify by induction new concepts in the form of rules to both guide the adaptive evolutionary programs and to add new geometric, material, or process resource constraints to the deductive memory from clusters of past process designs.

Features:

1. A self-improving, systematic, efficient, and orderly procedure for evolving knowledge in the form of concepts and rules associated with the task of process design for machining of mechanical parts.

2. Integrated use of parametric design (feature-based solid modelling), computer-based, inductive-deductive memory and evolutionary programs to automate process design for machining mechanical parts.

3. The ability of an inductive-deductive memory for process design enables a designer to simulate the machining of a material to obtain detailed and accurate cost information. Because the memory self-improves with use, the cost information is continually updated as new techniques, resources and knowledge are applied toward improving process productivity.

Application:

The inductive-deductive coupling involving the use of evolutionary programs can be applied to any and all process design tasks which involve mechanical parts of all types of materials using a variety of processes. The application to machining is of specific value to the Air Force because machining is generically performed on all mechanical parts regardless of the a priori forming process, e.g., forging, casting, etc. for metals or autoclave, resin transfer or compression molding, etc. for composites. Even in the case of 'net-shaped' forming, machining is almost always accomplished to provide a specified surface finish to one or more geometric features of a part.

With the ability to simulate the machining of material into any form—the system and process according to the invention is of use to many organizations, such as those responsible for validating the estimated cost of aircraft and ground support equipment spare mechanical parts, e.g., one organization will be prototyping this use, while a second organization, the Developmental Manufacturing and Modification Facility, will be exercising the inductive-deductive memory to maintain the currency and accuracy of the knowledge being utilized by the former organization.

DETAILED DESCRIPTION

The following seven items, copies of which are included as a part of this application as filed, include disclosures of the invention, and are hereby incorporated by reference. 1. AL-Kamhawi, H.N., Feature Sequencing in the Rapid Design System Using an Evolutionary Program, Masters Thesis, Department of Computer Sciences and Engineering, Wright State University, Dayton, Ohio, Jul. 993. 2. Pao, Y. H., Merat, F. L., & Radack, G. M., Memory-driven, Feature Based Design, WL-TR-93-4021, Materials Directorate, Wright-Patterson AFB, Ohio, Jan. 1993, Case Western University Contract Number F33615-87-C-5250, Distributed Jan. 1993. 3. Chen, C. L. P., LeClair, S. R., An Integration of Design and Manufacturing: Solving Setup Generation and Feature Sequencing Using Unsupervised Learning Approach, *Journal Of Computer Aided Design*, Butterworth-Heinemann Ltd London, UK, 1993, (in press).

4. Pao, Y. Komeyli, K., Goraya, T., & LeClair, S. R., A Computer-Based Adaptive Associative Memory in Support of the Design and Planning, *International Journal of Applied Artificial intelligence*, Hemisphere Publishing Company, Corp. N.Y., N.Y. (in press).

5. Pao, Y. Komeyli, K., Shei, D., LeClair, S. R. & Winn, A., The Episodal Associative Memory: Managing Manufacturing Information on the Basis of Simularity and Associativity, *Journal of Intelligent Manufacturing* on Neural Networks, Chapman & Hall, Ltd. Publishers, N.Y., N.Y., Vol 4, No. 1, Feb. 1993, pp 23–32.

6. Westhoven, T. E. Pao, LeClair, S. R., & Chen, C. L. P., Episodal Associative Memory Approach for Sequencing Interactive Features in Process Planning, *Artificial Intelligence for Engineering Design, Analysis and Manufacturing*, Academic Press, Harcourt Brace Jovanovich Publishers, N.Y. N.Y., Volume 6 Number 4, Dec. 1992, pp 177–197.

7. Westhoven, Feature Sequencing in Process Planning Using an Episodal Associative Memory, Masters Thesis, Department of Computer Science and Engineering, Wright State University, Dayton, Ohio, Nov. 1991 (Uncataloged in Wright State University Library as of 1 Jul. 1993).

DRAWING DESCRIPTIVE MATTER

Figure 1:
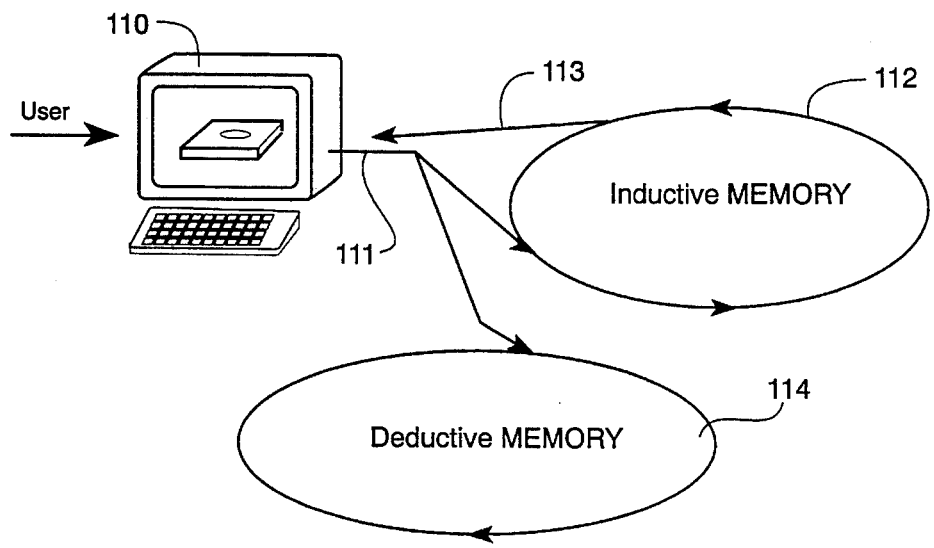
FIG. 1 is a diagram showing a Self-Improving Design System.

In the self-improving design system shown in FIG. 1, the user is a machinist and/or process designer who supplies input to the computer system 110. The system includes an inductive memory 112, which has episodal, associative and pattern recognition properties to provide past experience; and a deductive memory 114 which has numeric/symbolic, cognitive, and optimization properties to provide current knowledge. The inductive memory 112 via line 113 to the computer 110 provides information relating to past designs material/product/process. Output from the computer 110 via line 111 to the inductive memory 112 and the deductive memory 114 provides information relating to new designs material/product/process.

Figure 2:
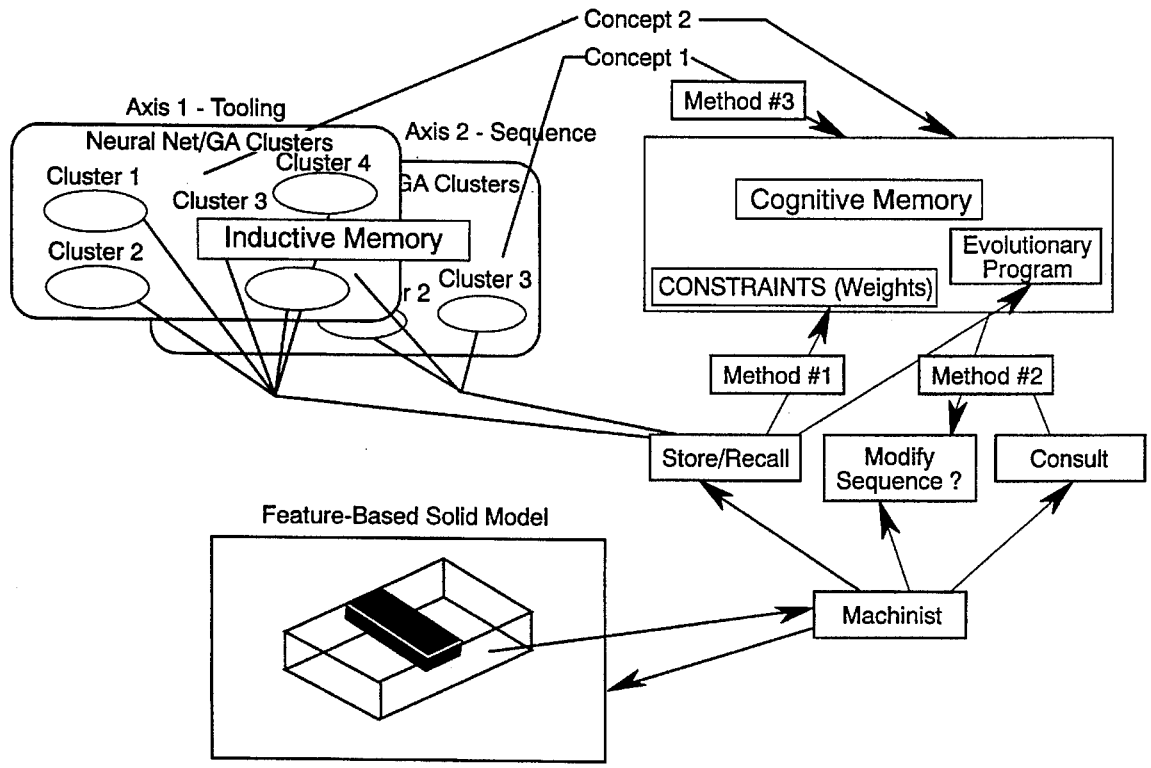
FIG. 2 is a diagram showing Inductive-Deductive Coupling for Machining Process Design.

FIG. 2 is a diagram showing Inductive-Deductive Coupling for Machining Process Design.

Figure 3:
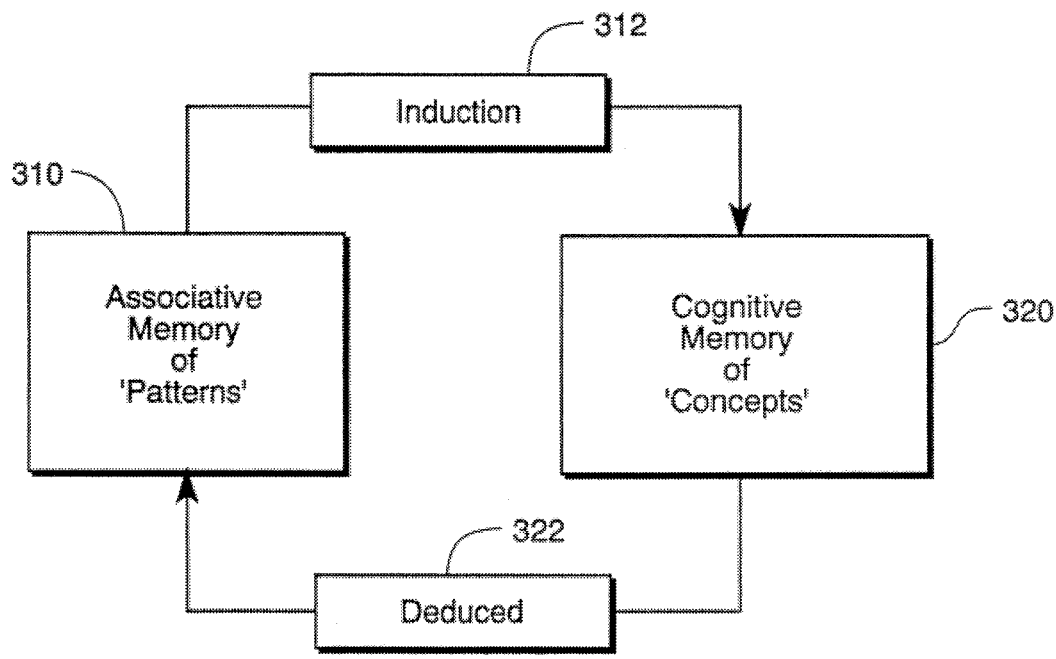
FIG. 3 is a diagram showing Inductive-Deductive Coupling.

FIG. 3 is a diagram showing Inductive-Deductive Coupling. Block 310 represents an Associative Memory of 'Patterns', or clusters of past design episodes. Block 320 represents a Cognitive Memory of 'Concepts', or learned rules/constraint for finding a solution. Block 312 represents induction (of new concepts) from block 310 to block 320; and block 322 represents deduced information (good solution).

Figure 4:
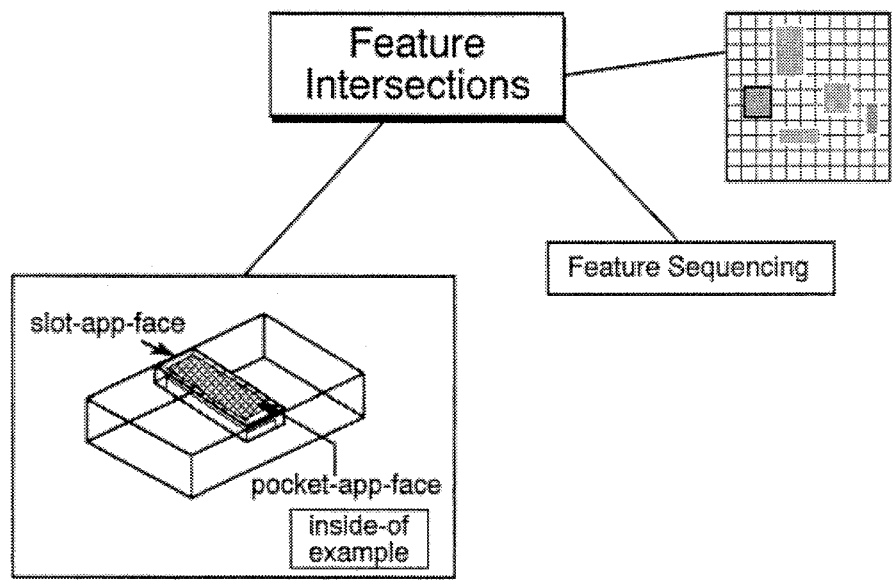
FIG. 4 is a diagram showing Feature Intersections.

FIG. 4 is a diagram showing Inductive-Deductive Coupling. Block 310 represents an Associative Memory of 'Patterns', or clusters of past design episodes. Block 320 represents a Cognitive Memory of 'Concepts', or learned rules/constraints for finding a solution. Block 312 represents induction (of new concepts) from block 310 to block 320; and block 322 represents deduced information (good solution).

FIG. 4 is a diagram showing Feature Intersections. An Association is based on: feature types, surface area & feature interactions, tolerance, material hardness, etc. A Cognition is based on: constraints/rules involving feature intersections which influence safety, quality, machining distance, tool changes, setups, etc.

FIG. 4 is a diagram showing Levels of Process Design, comprising setup generation 501, fisturing 502, feature sequencing 503, and operation sequencing 504.

Figure 6:
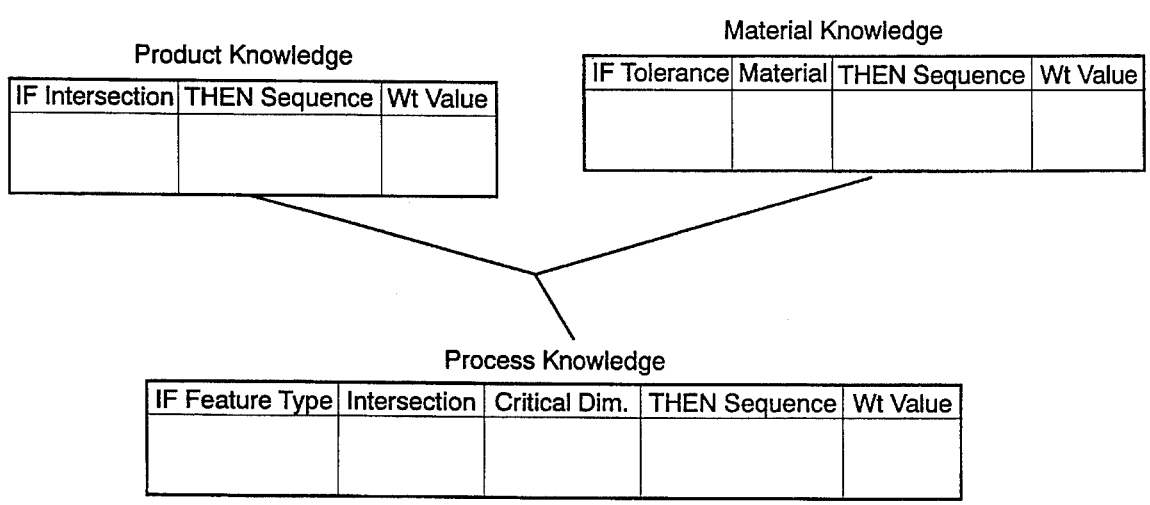
FIG. 6 s a diagram showing Integrated—Competed Knowledge

FIG. 6 is a diagram showing Integrated-Competed Design Knowledge.

Figure 7:
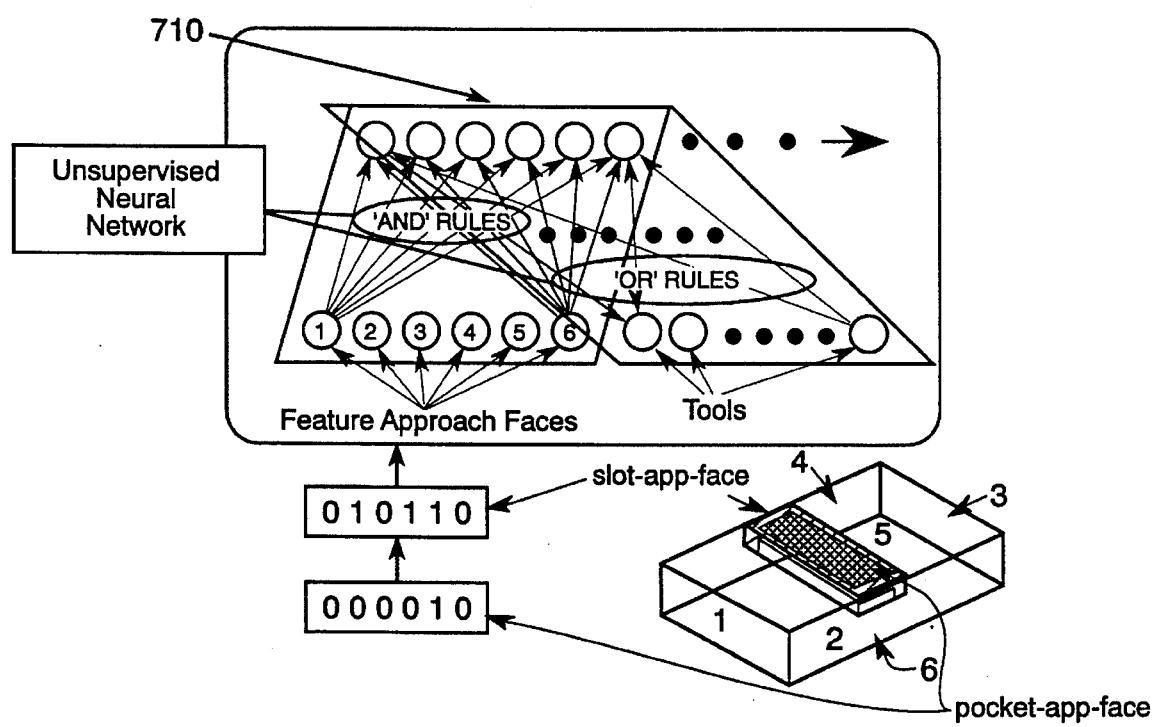
FIG. 7 is a diagram showing Self-Organizing Setup Generation.

FIG. 7 is a diagram showing a Setup Generation Network, with setup clusters (groups of features) 710.

Figure 8:
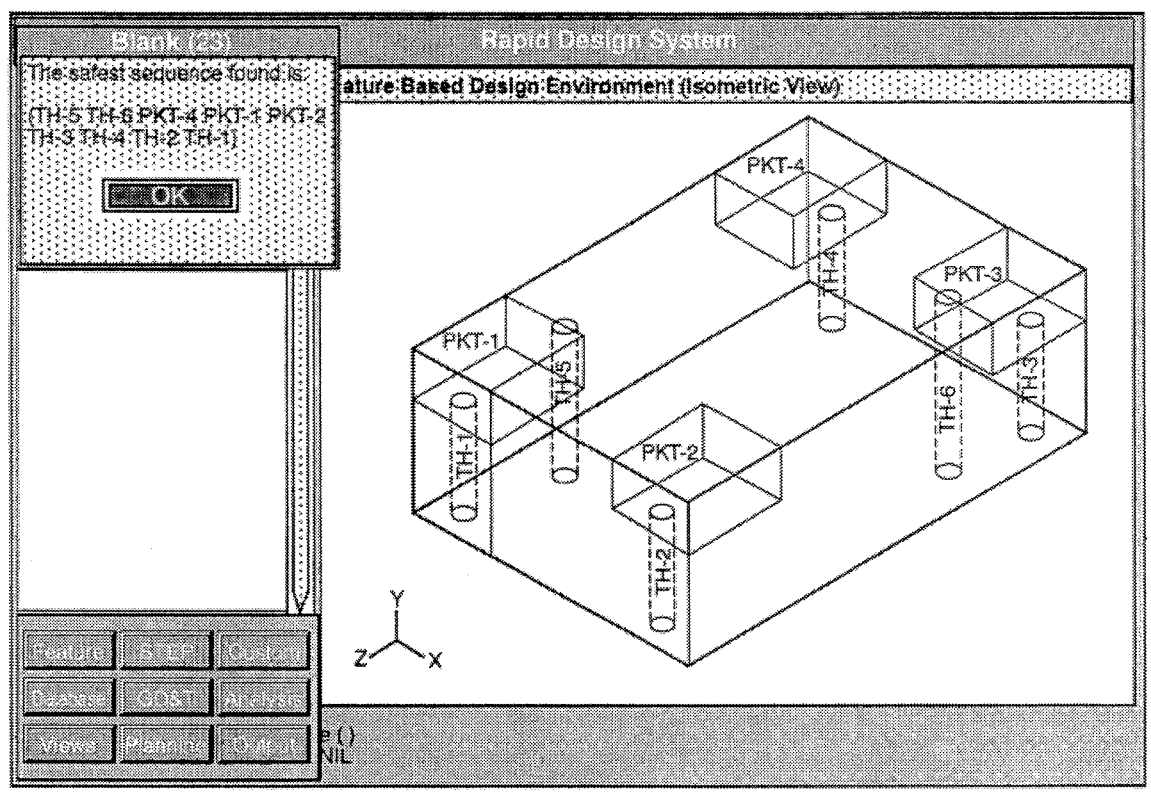
FIG. 8 is a diagram of a computer screen display showing Feature Sequencing (Emphasis on Safety)

FIG. 8 is a diagram of a computer screen display showing Feature Sequencing (Emphasis on Safety).

Figure 9:
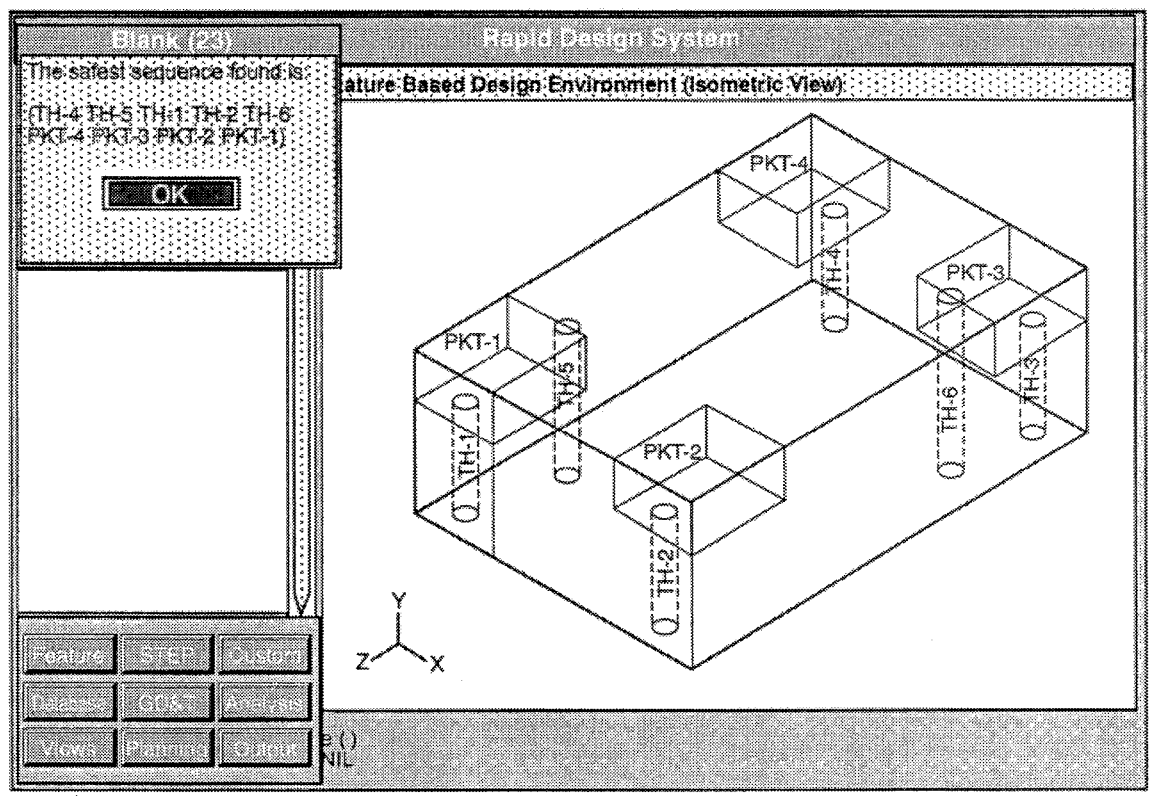
FIG. 9 is a diagram of a computer screen display showing Feature Sequencing (Emphasis on Speed)

FIG. 9 is a diagram of a computer screen display showing Feature Sequencing (Emphasis on Speed).

Figure 10:
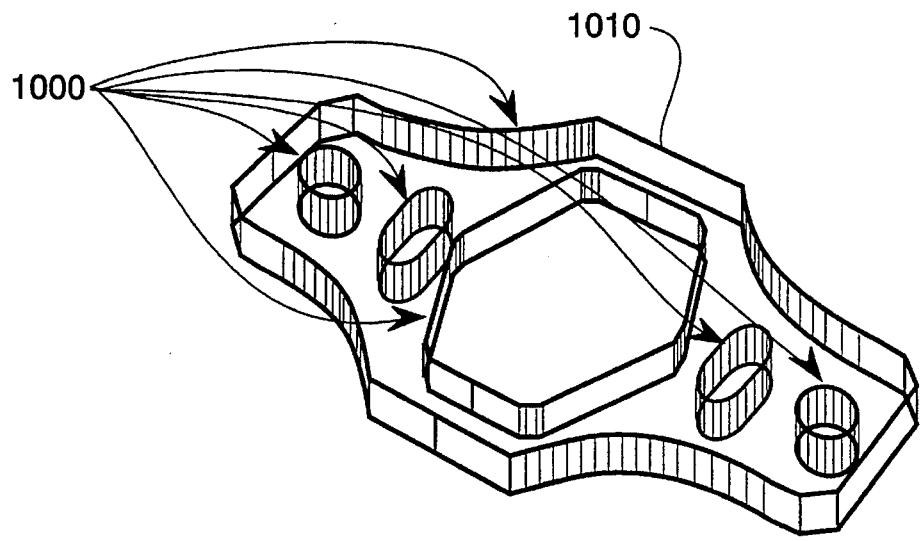
FIG. 10 is a diagram showing Feature Sequencing for an Engine Support Equipment 'Anchor Plate'.

FIG. 10 is a diagram showing feature sequencing for an Engine Support Equipment 'Anchor Plate', with FEATURES 1000 comprising profile (PR), holes (HL) and pocket (PK) supplied for the anchor plate 1010. The Feature Sequence* is PR →PK →HL. A *RULE for the feature sequence is: Largest Surface Area First.

Figure 11:
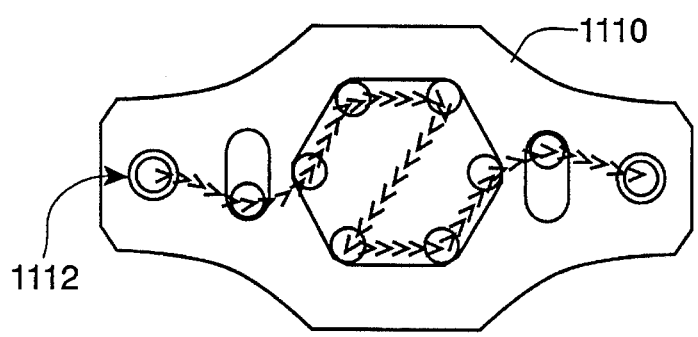
FIG. 11 is a diagram showing Operation Sequencing for an Engine Support Equipment 'Anchor Plate'.

FIG. 11 is a diagram showing operation sequencing for an Engine Support Equipment 'Anchor Plate', with an Operation Sequence 1112 to the anchor plate 1110, shown in the following table.

| FEATURES | OPERATIONS | | | |
| --- | --- | --- | --- | --- |
|  | Ctr Drill | Drill | Mill (Rough) | Mill (Finish) |
| Profile |  |  | 1 | 2 |
| Holes | 1 | 2 |  |  |
| Pocket | 1 | 2 | 3 | 4 |

Figure 12:
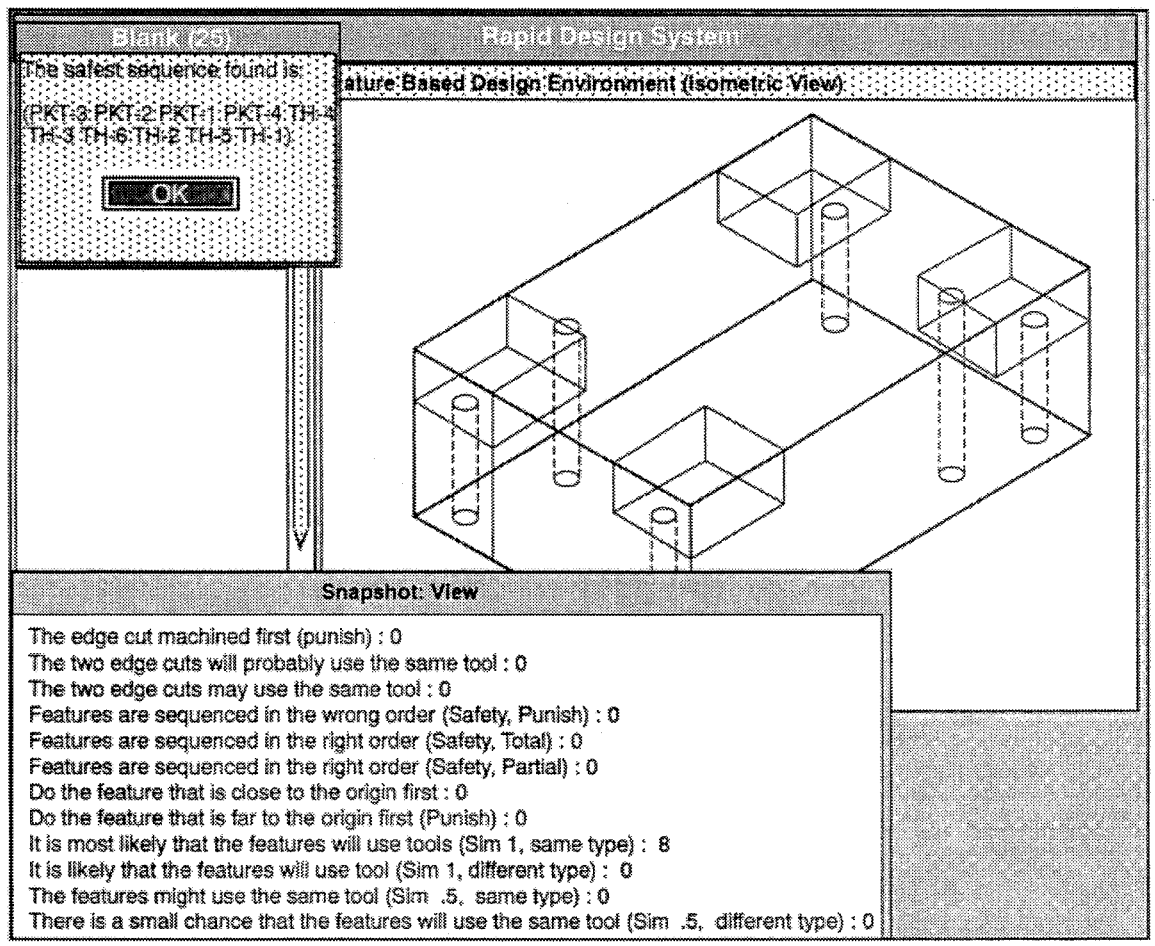
FIG. 12 is a diagram a computer screen display showing Rule Firing for Candidate Process Design.

FIG. 12 is a diagram of a computer screen display showing Rule Firing for Candidate Process Design.

Figure 13:
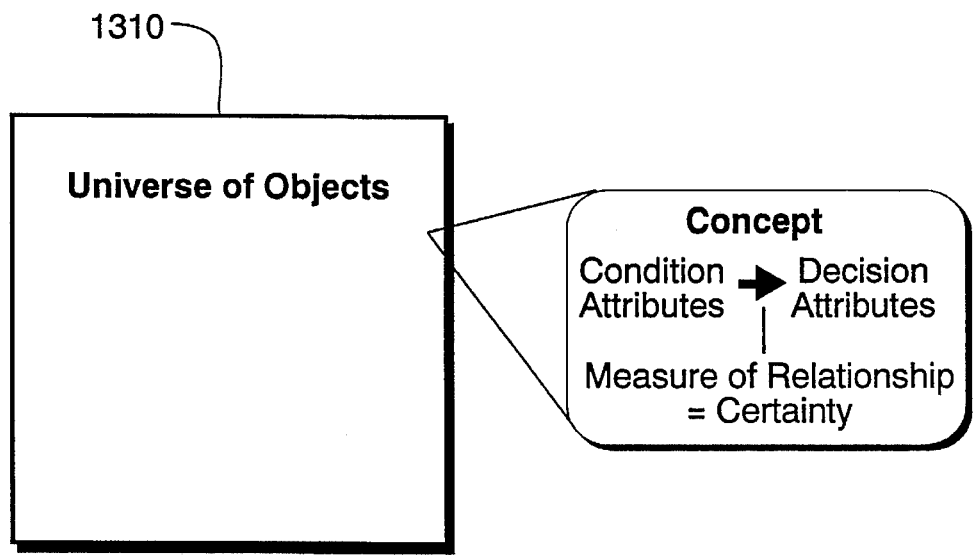
FIG. 13 is a diagram showing a Concept Generation Technique.

FIG. 13 is a diagram showing Rough Set Concept Formation. Block 1310 shows a Universe of Objects as follows:

| Object | Attribute Values |
| --- | --- |
| Object | Attribute Values |
| Object | Attribute Values |
| Object | Attribute Values |
| Object | Attribute Values |

Figure 14:
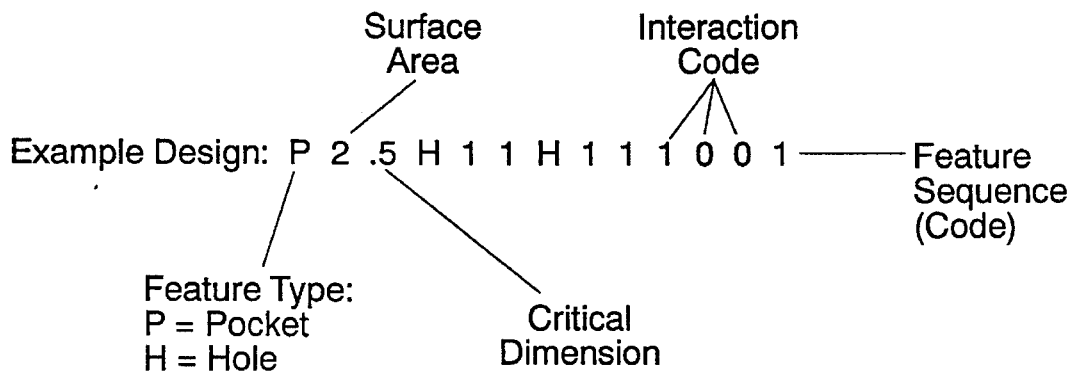
FIG. 14 is a diagram showing Example Design Attributes.

FIG. 14 is a diagram showing an Example of Design Attributes.

Figures 15, 16:
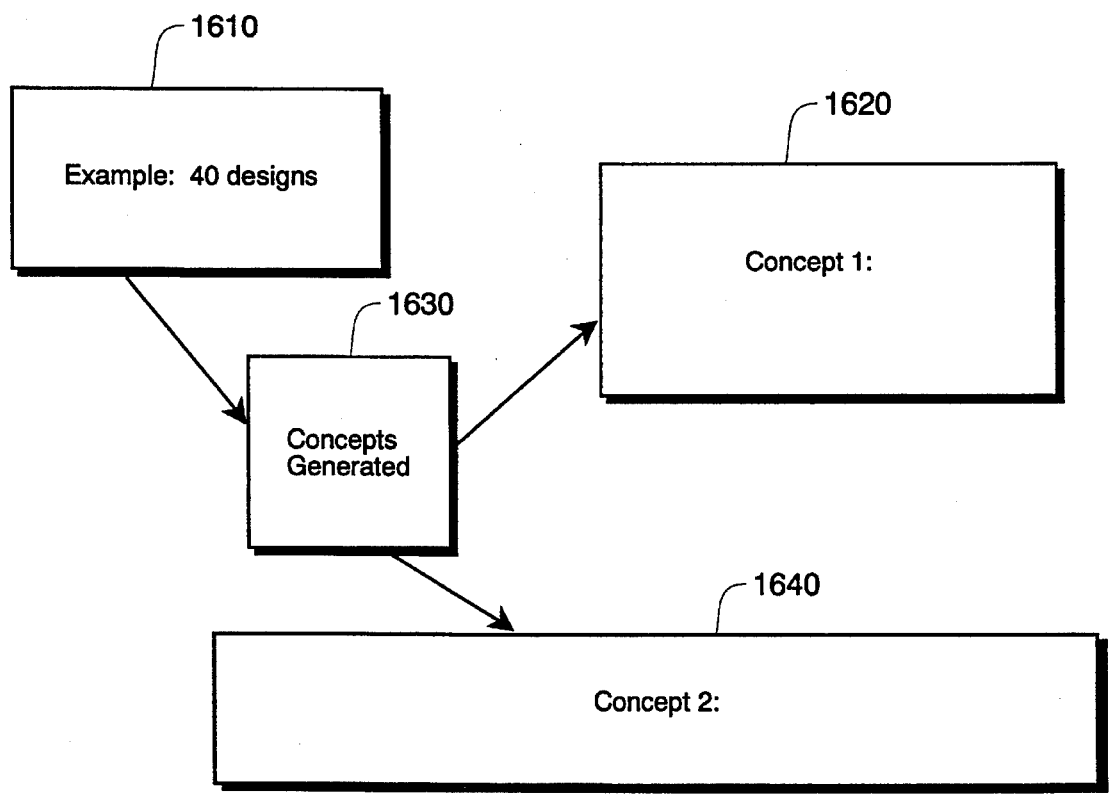
FIG. 15 is a diagram showing Example Tabular Results.
FIG. 16 is a diagram showing Example Concept Results.

FIG. 15 is a diagram showing an Example of Tabular Results, with the Legend:

Interaction Matrices: paired interactions of feature types in the design

Features: numbers of the columns containing the feature types

Certainty: ratio of the cardinality of the lower set to that of the universe set FIG. 16 is a diagram showing Example Concept Results. The legend for block 1610 is "Example: 40 designs Three feature types in each design—with surface area and critical dimension not considered". The legend for block 1620 is "Concept 1: If all feature types are considered, THEN the certainty of the influence of the interaction matrices and all the feature types on the feature sequence is roughly 9/20." The legend for block 1630 is "Two Concepts Generated by the Analysis". The legend for block 1640 is "Concept 2: IF only the first and second or first and third feature types are considered, THEN the certainty of the interaction matrices and these feature types on the feature sequence is roughly 31/40.

FIGS. 16–26 are flow charts.

General—In the design of the process to machine discrete mechanical parts, the sequence of removing material is arrived at to ensure that the resulting part is of the correct geometry and finish, and the process is safe, feasible and accomplished in minimum time. The process design task is complicated by material property, shape and geometric complexity and further by the number of interdependencies between distinct shape features and common processing operations. Although the resultant difficulty of the sequencing problem can be minimized with the choice of setup, the process design is still non-polynomial complete, i.e., the difficulty in finding a solution (an optimal or near optimal sequence) grows exponentially as the size of the problem grows polynomially in terms of the quantity of the above discussed complications.

For complex parts, an experienced machinist can develop a suitable process design by relying on his experience in machining similar parts. The machinist makes use of inductive methods (pattern recognition) to relate similar part material, geometries together with interdependencies and their associated machining sequences which have produced quality parts in the past with minimum time expended. If no previous part geometries are similar, the machinist must use deductive methods to generate a sequence by relating feature attributes (relative size and position) and relations (intersections and common tooling) to heuristics generated from previous design experience. When one or both of these methods are used, the machinist is capable of developing a good, but not necessarily an optimal, machining sequence for both features and operations. Of interest is the interaction between the two methods because their coupling enables a self-improving design system to be realized as depicted in FIG. 1.

In this approach, a feature-based solid modelling software environment provides the elements of a symbolic language for describing a discrete mechanical part in terms of its product and process design. The language is based on the use of features (categories of shape and shape related information) which the designer and/or machinist uses to associate and reason about the part and interaction between the machine, tool, fixture and starting raw stock for the various process design options involving the milling and drilling sequence for removing material. Once the geometric features are specified as illustrated in FIG. 2, the machinist can either recall from experience, past designs contained in an associative memory, and/or activate generalized rules or constraints in a deductive memory to provide a feasible 'good' design. As additional non-geometric features (tolerance, surface finish and material properties) are provided both feature and operation sequencing are refined.

Discussion—We have discovered an approach and a practice which enables the machinist/process designer to automate the design and visualization of the various feature and operation sequencing alternatives posed by the complexity of a mechanical part design. Our methodology automatically and systematically provides the machinist and/or process designer with 1) associative retrieval of past similar process designs (setup, feature and operation sequencing levels), and/or 2) deductive generation, with or without deciding on a specific setup, a new process design specifically for the part design in question.

Figure 17:
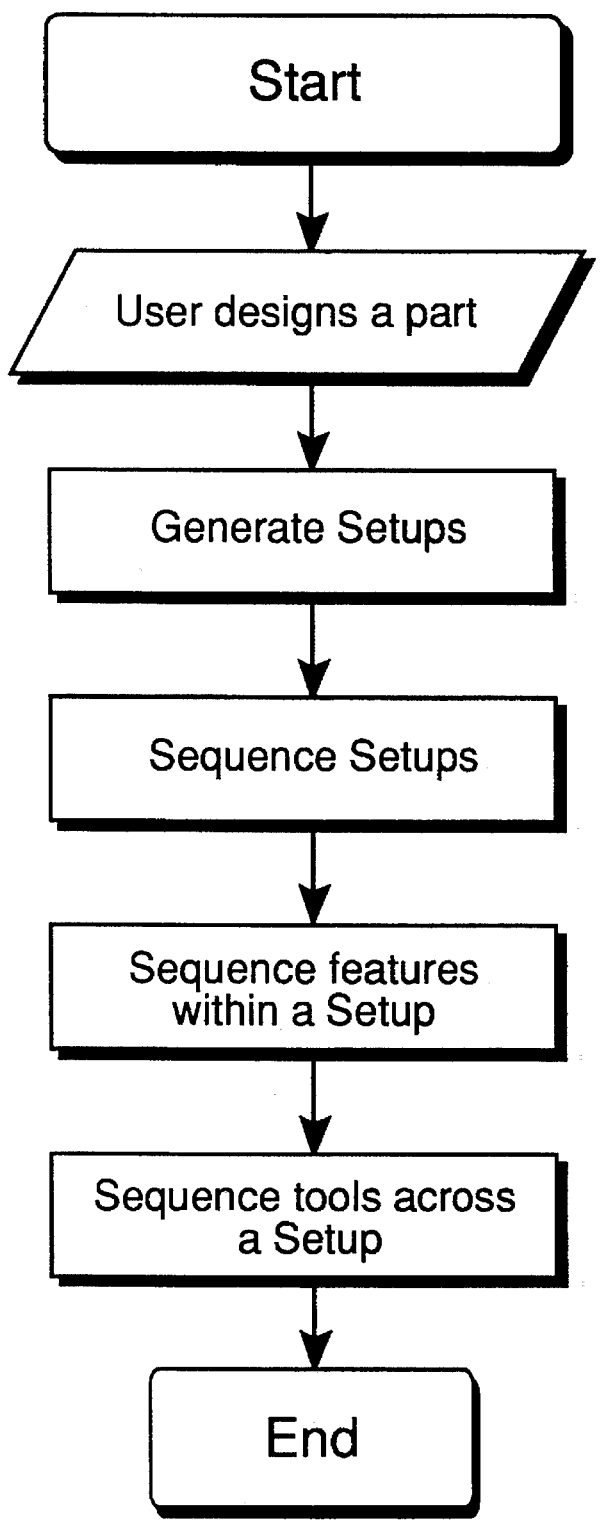
FIG. 17 is a flow chart of Deductive Memory Architecture.

FIG. 17 is a flow chart which describes the overall architecture of the deductive memory part of the system. It describes the steps the designer has to go through to generate a near optimal process plan.

Once a process design is selected, whether based on a previous or new design (to include modifications of either), the selected design is automatically stored in memory: 1) to reorganize past design groupings, 2) to update constraint weights and 3) to update selection criteria on the evolutionary programs used to generate future new designs.

The complexity of the process design is largely dependent on the number of features and operations and, more specifically, the number of intersections between the features and between operations. Our approach in identifying feature intersections (FIG. 4) involves the generation of an intersection matrix constructed from the binary comparison of all feature approach faces to determine if the features are: one "inside of" another (full intersection), one partially overlapping another (partial intersection), and no overlap (no intersection)

Operation intersections are not physical, as in feature intersections, but have more to do with what is common about two or more operations relative to the cutting tools and machines they have in common. When two or more features share common tools or machines there is opportunity to reduce tool changes by sequencing the operations contiguously. As a consequence, alternative sequences need to be evaluated to assess the impact on time to machine, tool changes, etc., in selecting the optimum sequencing of operations, as shown in the flow chart of FIG. 19.

To solve the complete, or any part of, the problem to design a process to remove material through machining, a machinist/process designer can always refer to a process used on a similar part previously encountered. To augment the recall of the machinist/process designer an associate memory is used to store and retrieve parts and their associated process designs based upon similarity. Such an associative memory is referred to as an Episodal Associative Memory (EAM). The EAM is a memory that can efficiently and accurately connect a given problem or idea to relevant information. The EAM utilizes either an unsupervised neural network or genetic algorithm to self-organize designs on the basis of features: both geometric and non-geometric. This means that there are clusters of designs which are similar on the basis of overall dimensions, or on the basis of surface area, etc.

The function of the EAM is to aid the human designer in remembering not only process designs embedded in the system but also associated experience (processing problems and causes) acquired from prior episodes. By using the self-organizing aspects of an associative memory, nesting and intersection relationships among setups, features and operations can be organized into "regular" groups or categories of information with which a rule-of-thumb can be associated. By creating an associative memory that the process planners can "teach", we can transfer the burden of knowledge capture to the machine which is much more patient, attentive, and remembers more details than a human.

Figure 5:
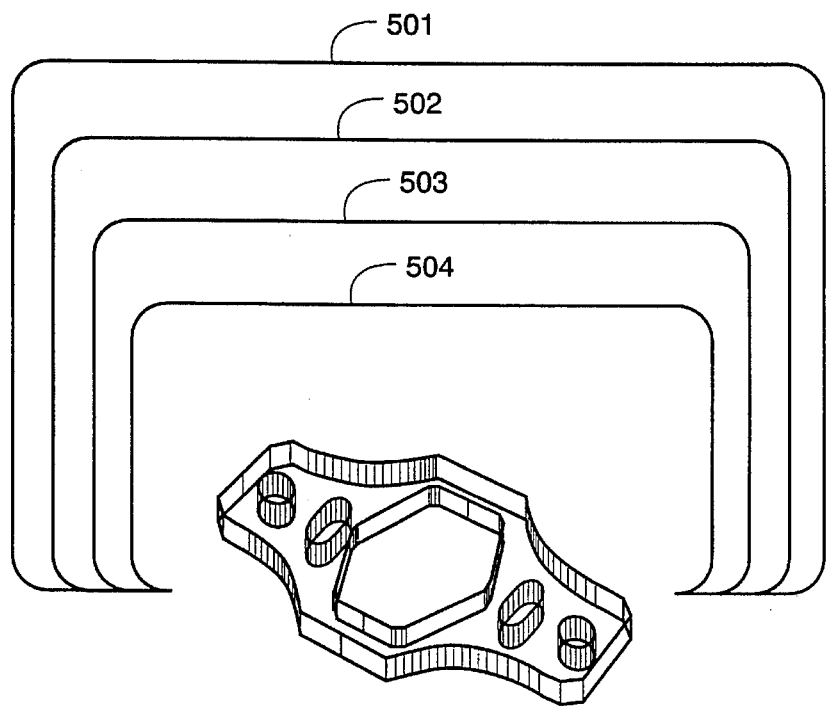
FIG. 5 s a diagram showing Levels of Process Design.

If a similar past design can not be found and/or a new process design is desired, the approach is to use a deductive memory to generate a new process design. The deductive memory addresses the process design at four levels ( reference FIGS. 5 and 17); 1) the creation of setups, 2) sequencing of setups, 3) sequencing of features and finally 4) the sequencing of operations. At each level, three categories of design knowledge (illustrated in FIG. 6) in the form of constraints are integrated and competed: material (i.e., inherent or to be generated properties of the material which may affect product quality), product (i.e., geometric features of the product which affect safety in terms of damage to the product, processing resources or the operator while undergoing processing), and process (i.e., aspects of the process such as travel distance of the machine tool or changes of tooling which directly affect overall speed of the process). All constraints at each level must be reconciled and therefore optimized together.

Use of the design system begins with a machinist/process designer drawing a model of a mechanical part via an interactive, graphical Feature-Based Design Environment (FBDE) for creating, manipulating, and editing a feature-based part model. FBDE is based on the premise that designers should be able to specify a part in terms of features which are meaningful to them instead of having to specify geometric primitives. All designs begin with a volume of material called the "starting feature." The starting feature can be a rectangular block, cylinder, or extrusion of an arbitrary two-dimensional profile. The designer "designs" by adding positive feature(s) such as a rib, removing the negative feature(s) such as holes and pockets, or modifying any of the above feature(s) to,the starting feature, as shown in FIG. 17.

Once a part is defined in terms of features, the minimum number and optimal sequence of setups must be selected to cost effectively produce the mechanical part. Setup selection is a pivotal step because it requires the organization of features into groups while determining a sequence necessary to make these features with alternative fixturing configurations. Based on the approach face of each feature and tool commonality across all features, a Self-Organized Setup Generation Technique (involving an unsupervised neural network) with AND-OR updating rules is used to cluster features into candidate setups. An illustration of the network is shown in FIG. 7.

To determine setup sequence, a number of constraints are competed: 1) regarding safety—setups that have features located on the edges of the starting feature (material stock) should be sequenced last, 2) speed—sequence setups that cause the least amount of material removal first, and 3) quality—setups that cause the least amount of disturbance in the stability (fixturing integrity) of the part should be sequenced first. We have developed an adapt evolutionary program, i.e., a genetic algorithm coupling a fitness function with a learning algorithm to obtain the setup sequence. An evaluation of the above criteria may require several iterations between setup sequencing and fixture configuration to minimize feature interaction across setups. Once the setup sequence is determined, based on the fundamental 3-2-1 fixturing principle, a fixture configuration for each setup is generated automatically.

Figure 18:
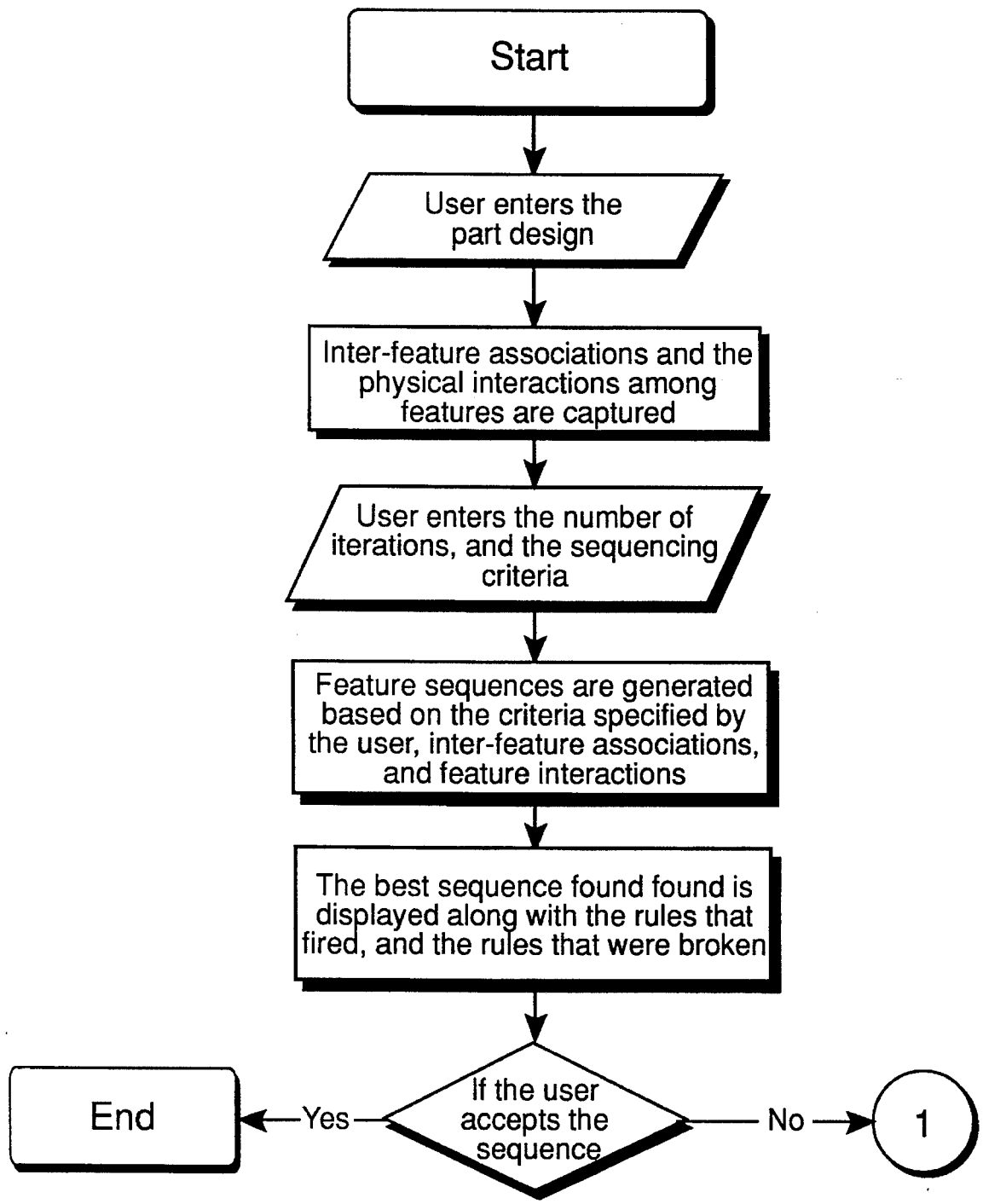
FIG. 18 is a flow chart of Feature Sequencing.
Figure 19:
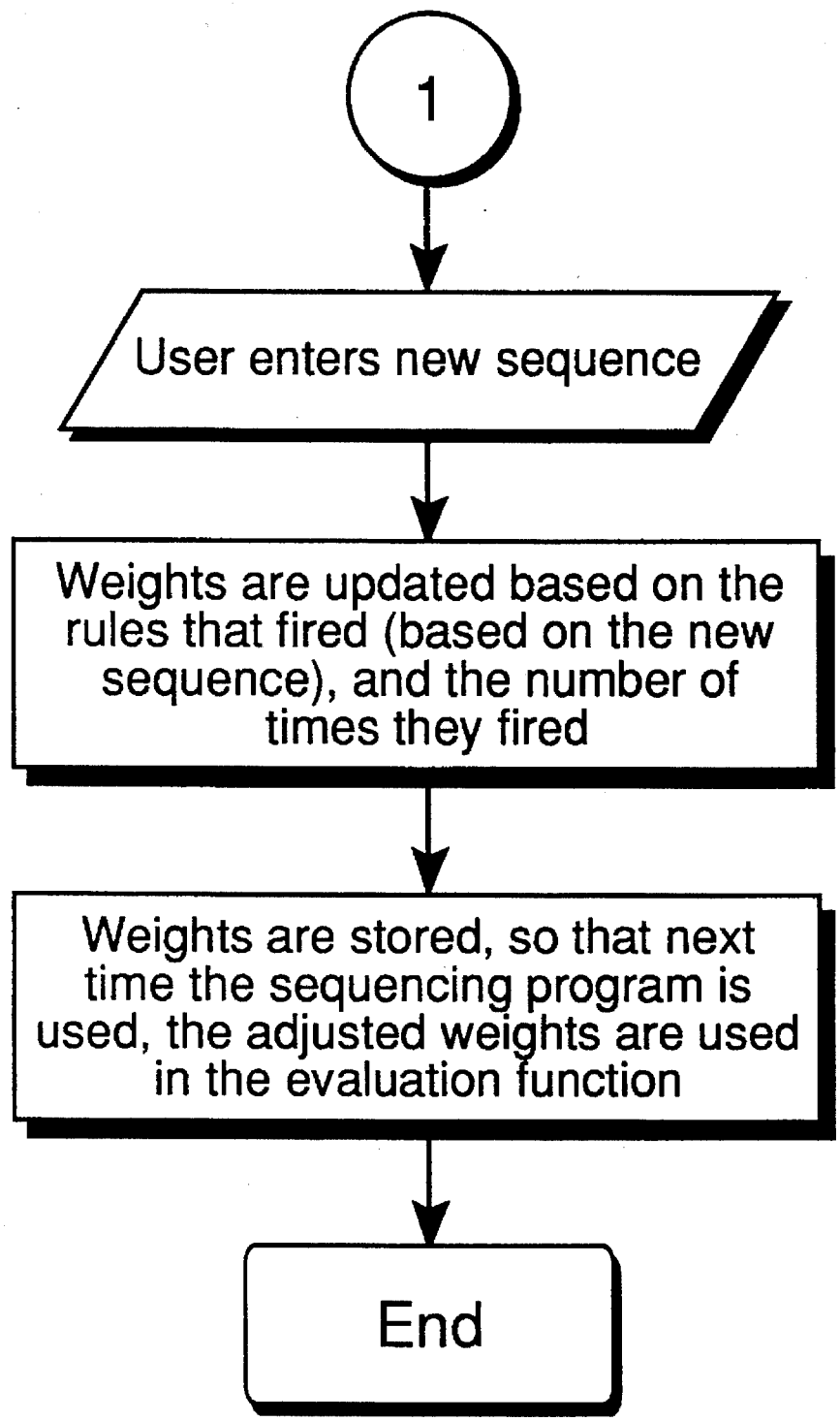
FIG. 19 is a flow chart of Continuation of Feature Sequencing.
Figure 20:
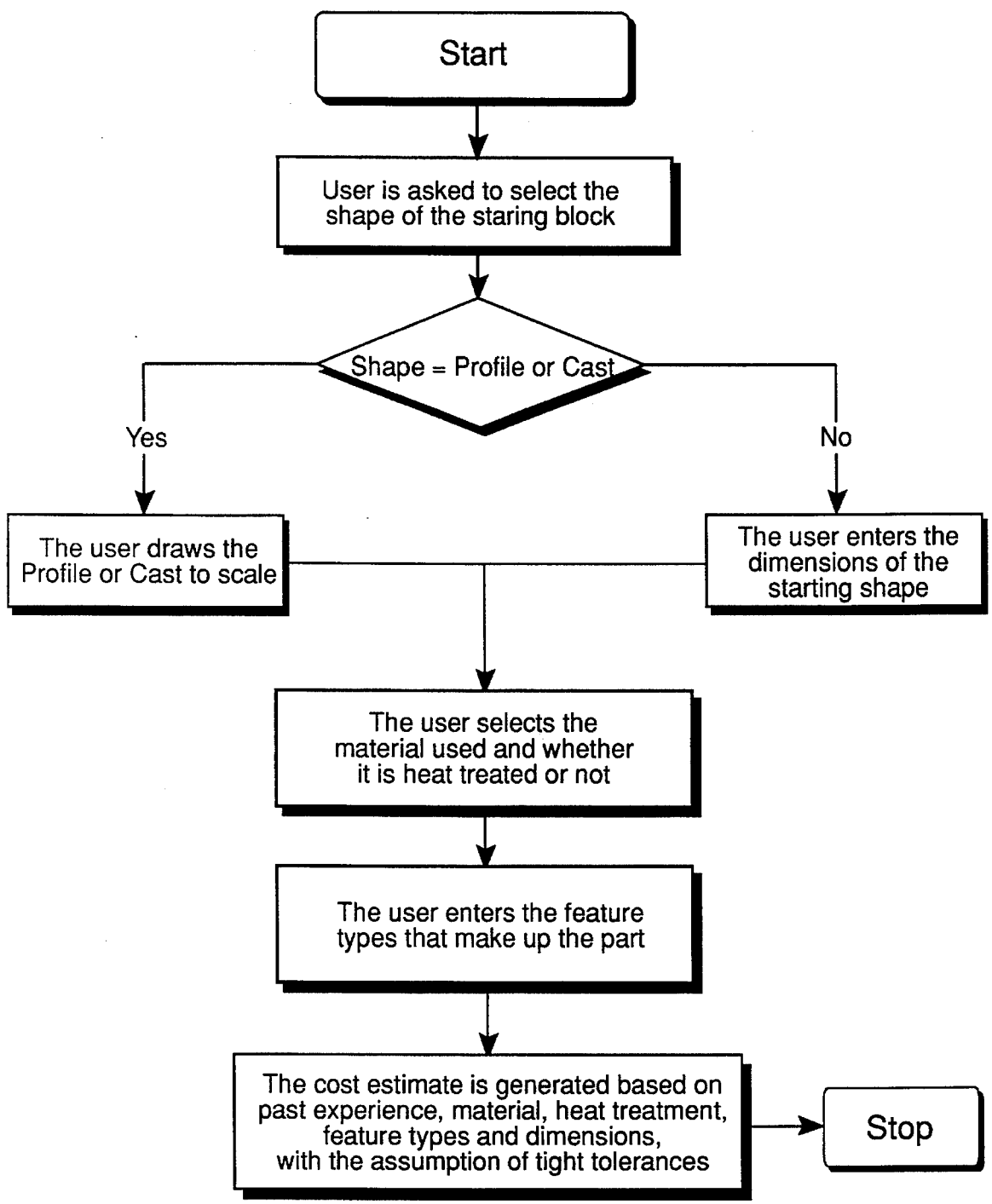
FIG. 20 is a flow chart of Cost Estimator.
Figure 21:
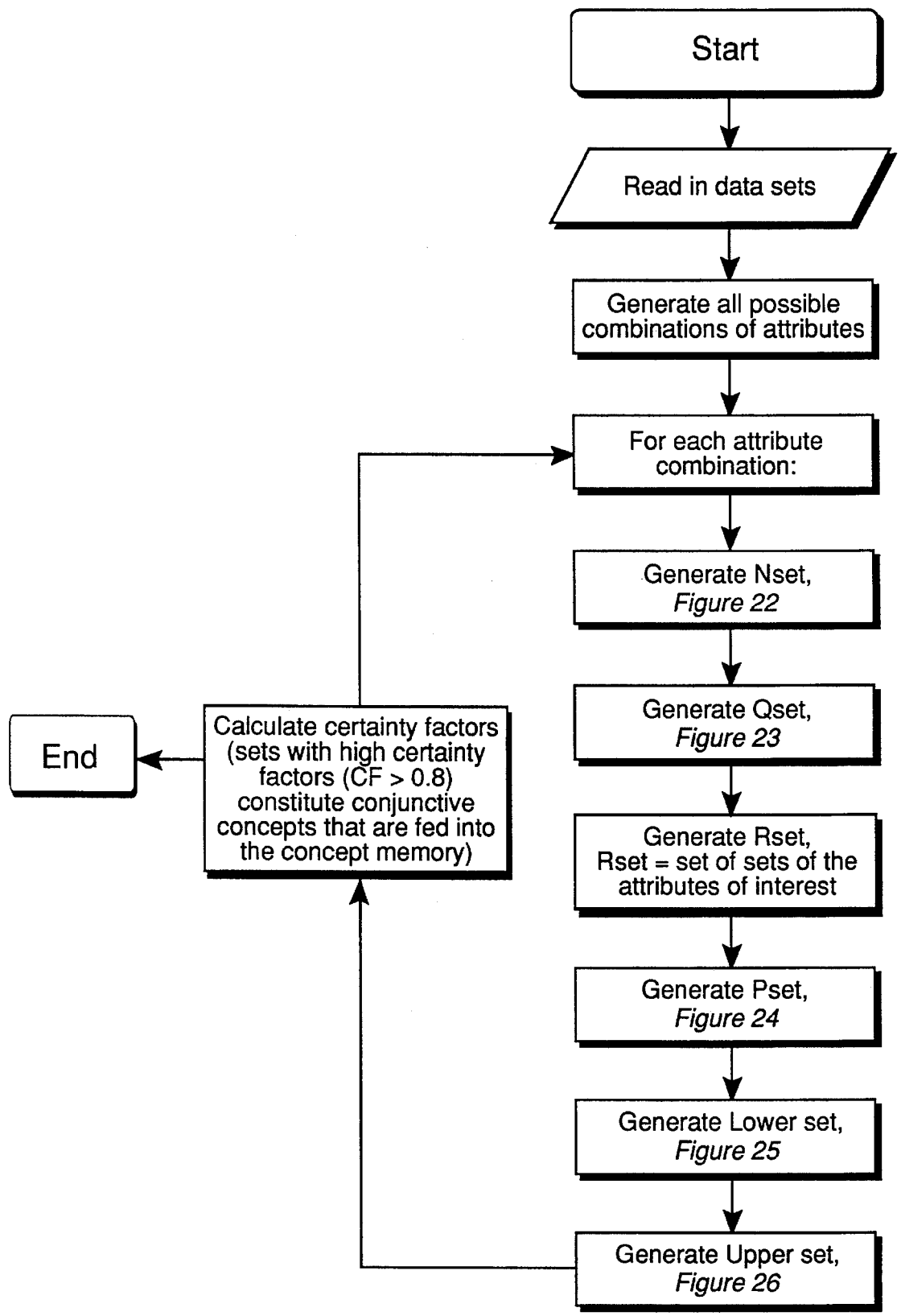
FIG. 21 is a flow chart of Rough Sets.
Figure 22:
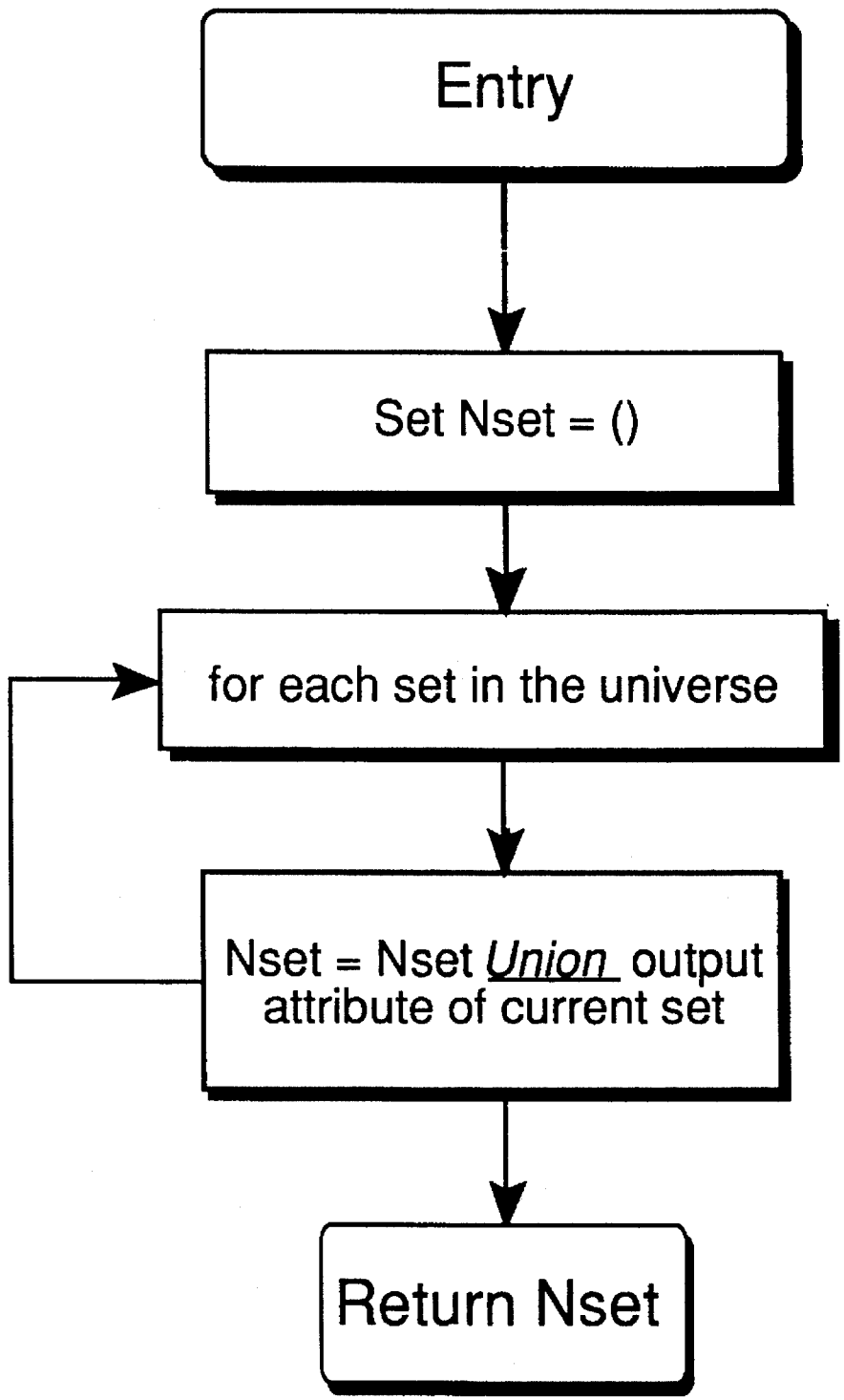
FIG. 22 is a flow chart of Nset Generation.
Figure 23:
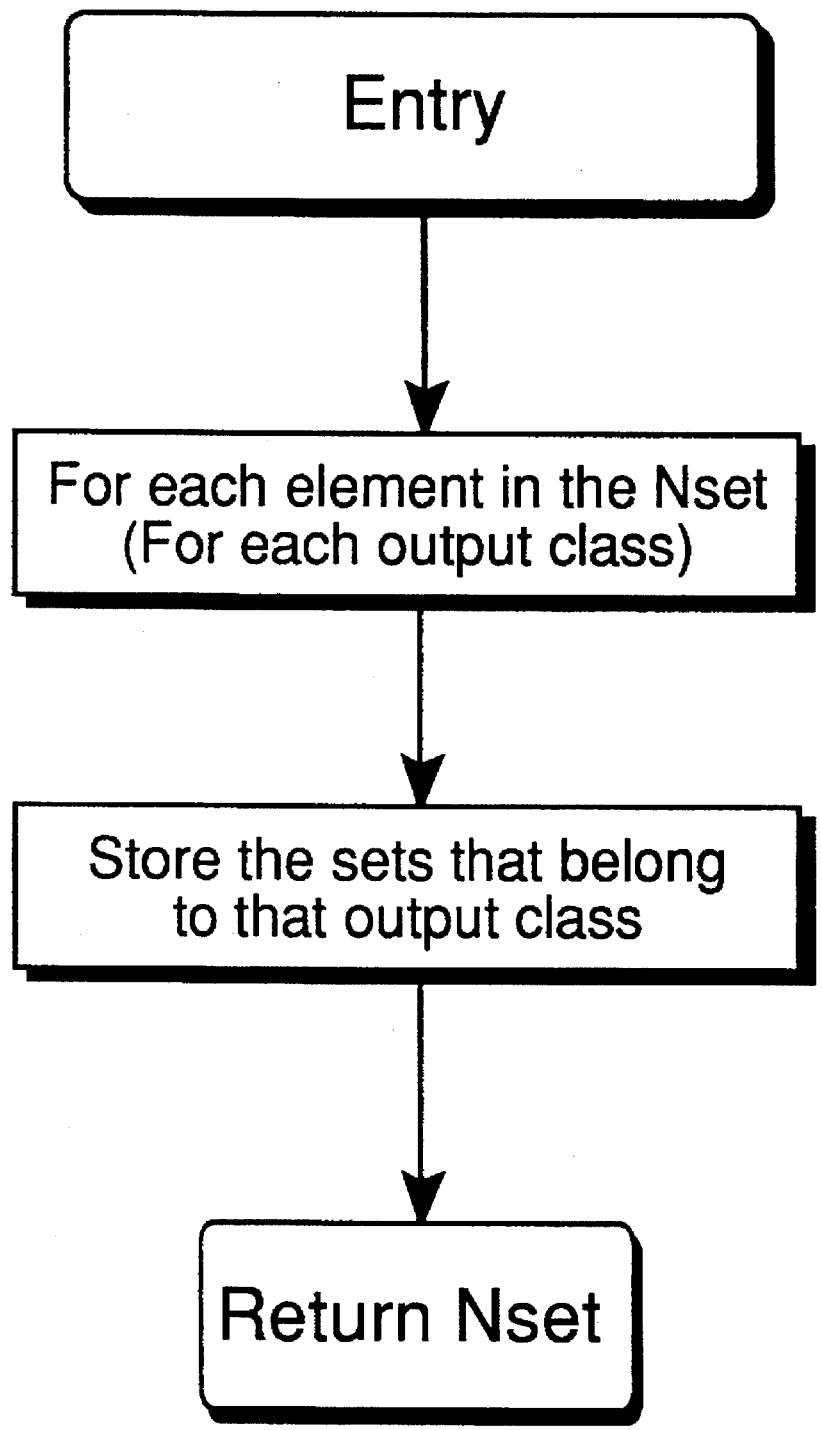
FIG. 23 is a flow chart of Qset Generation.
Figure 24:
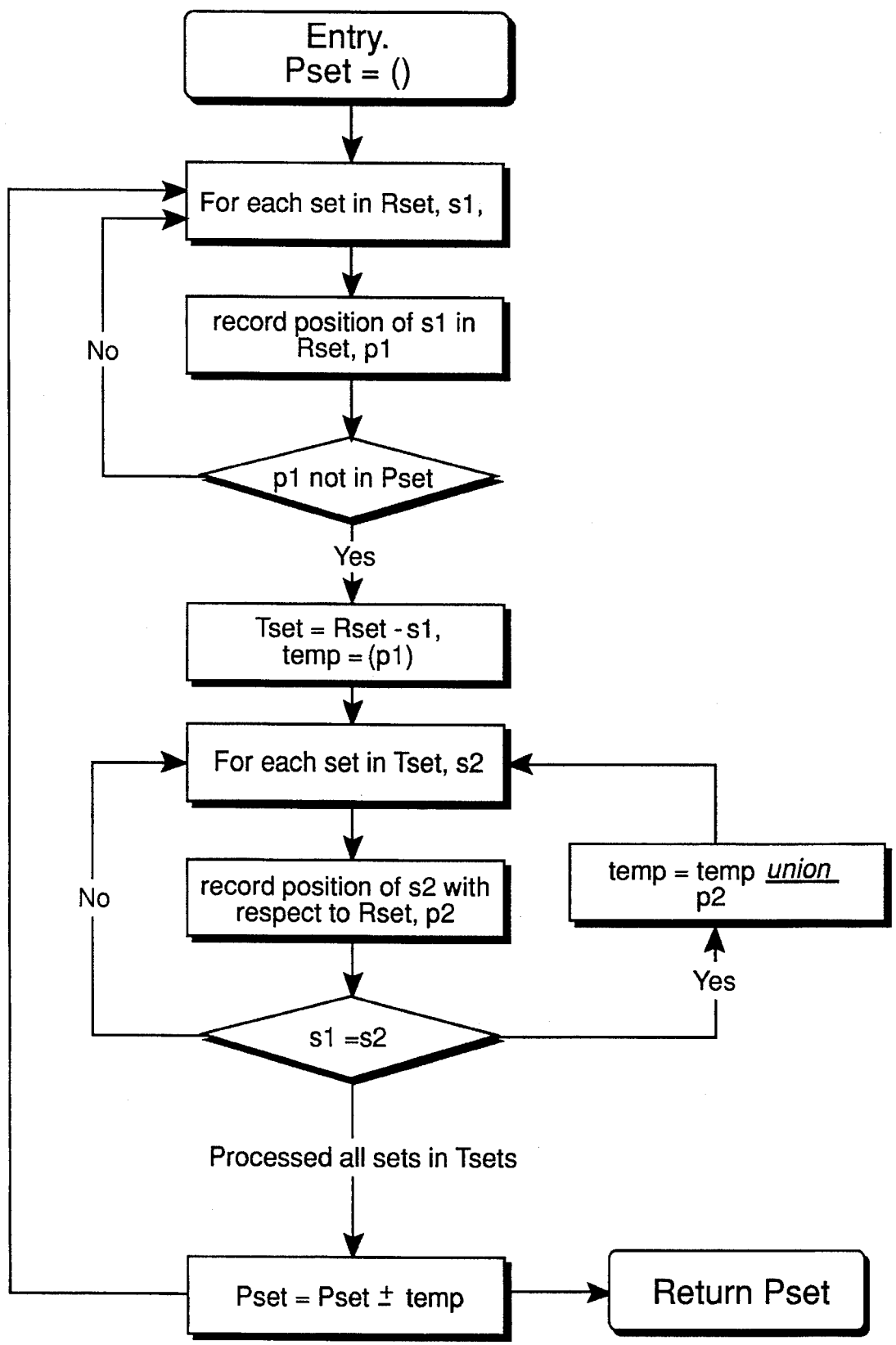
FIG. 24 is a flow chart of Pset Generation.
Figure 25:
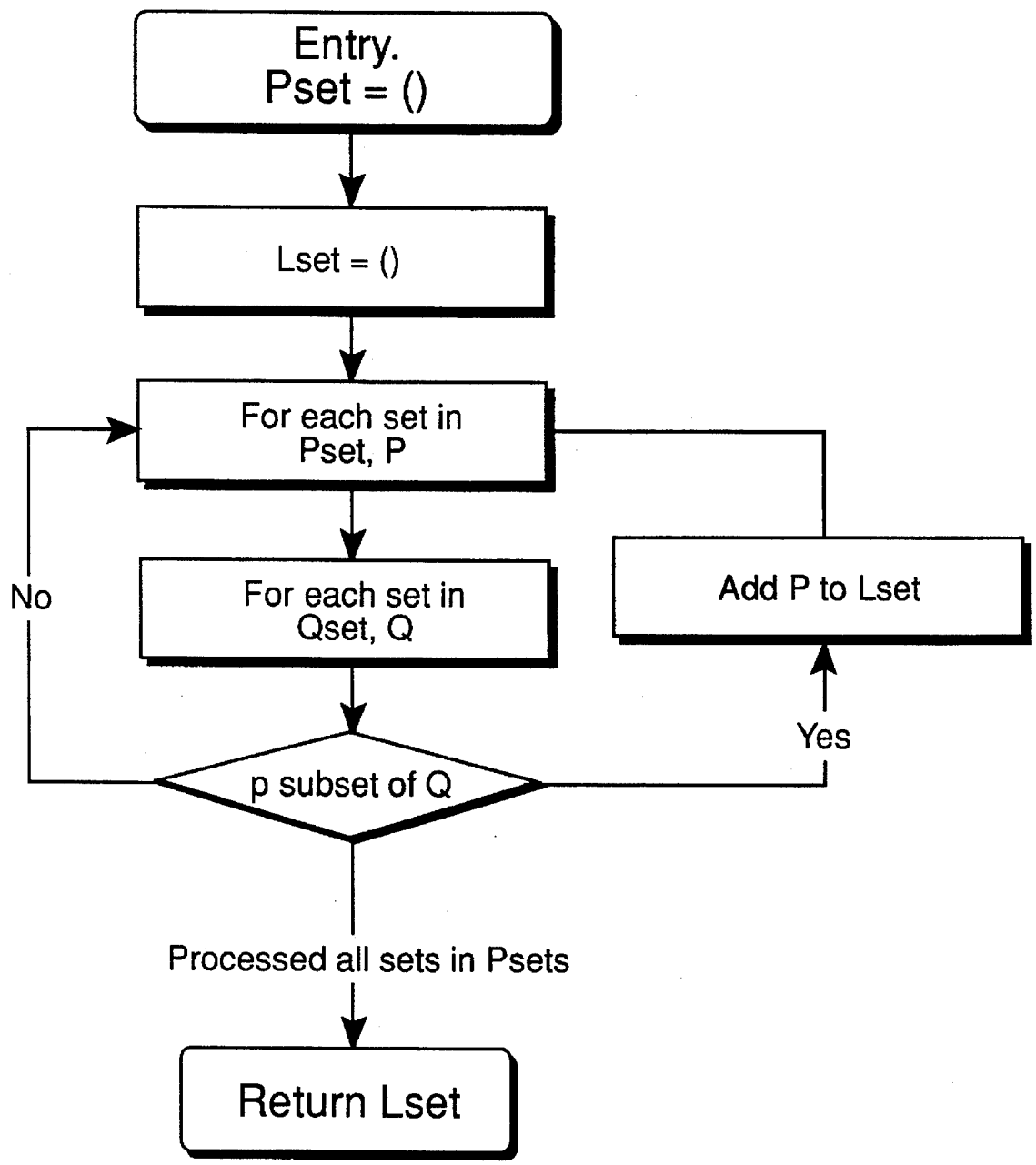
FIG. 25 is a flow chart of Lower Set Generation.
Figure 26:
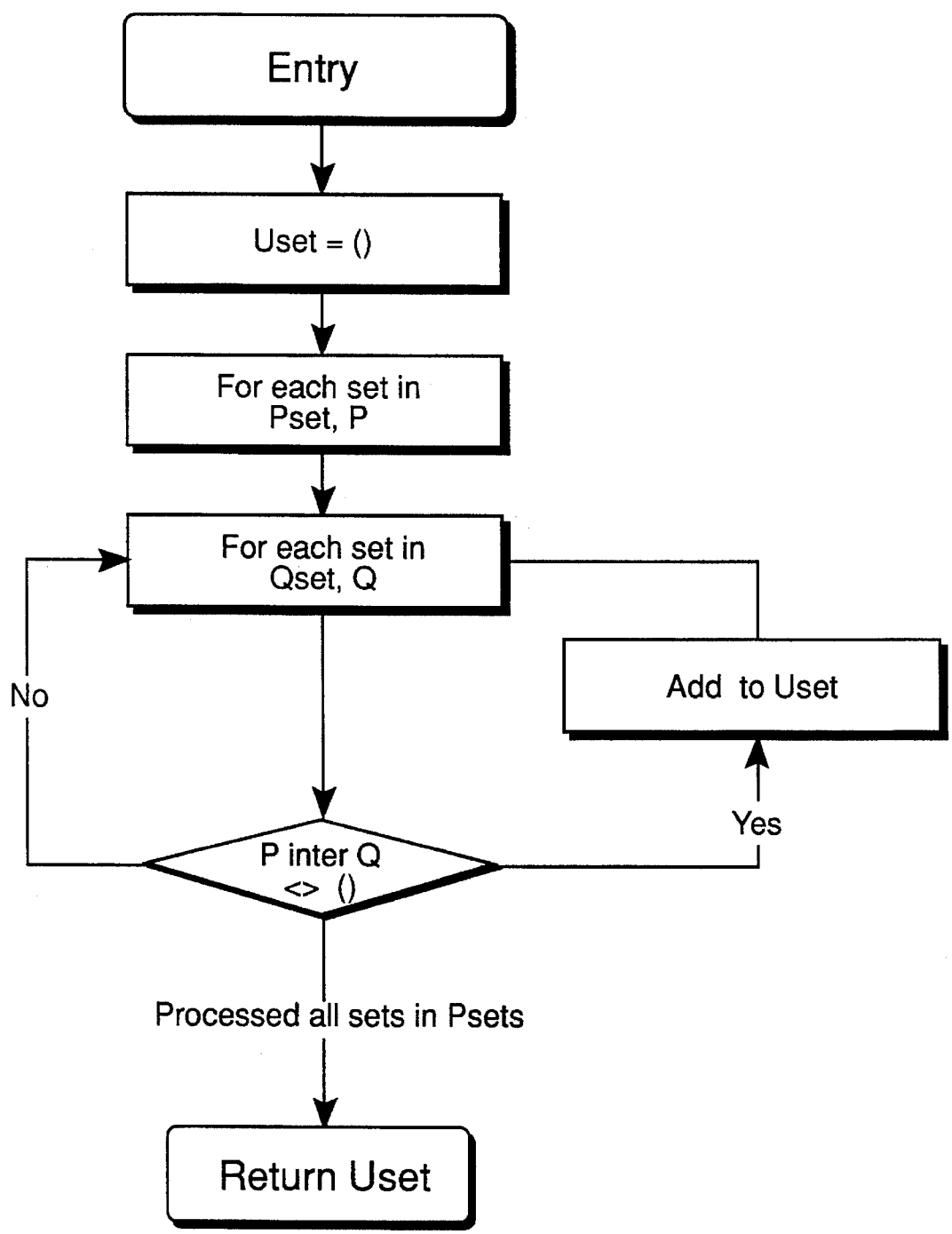
FIG. 26 is a flow chart of Upper Set Generation.

A flow chart for feature sequencing is shown in FIG. 18. To determine feature sequences in each setup, we have distinguished between intersecting and non-intersecting features. Intersecting features are nested together, and their sequence depends on tools, materials, geometric constraints, and manufacturing practice. Intersecting features are constrained sequences (i.e., a limited number of feasible sequences), while non-intersecting features are usually unconstrained. Like setup sequencing, to determine a feature sequence, three categories of constraints: material (quality), product (safety), and process (speed), are considered. And, again we have utilized an adaptive evolutionary program to obtain an optimal or near-optimal feature sequence given these three criteria. FIG. 8 illustrates a feature sequence for a mechanical part which emphasizes product (safety), while FIG. 9 shows a sequence which emphasizes speed. In comparing the two sequences, it is apparent that alternative sequences exist and the priority of the criteria is selectable by the machinist/process designer.

To determine the operation sequence for each setup we are guided and constrained by the feature sequence. The feature sequence provides the starting point (seed) that is used by the adaptive evolutionary program. For each design feature a number of operations may be required to machine the feature, i.e., to machine a hole a machinist may need (depending on the material) to center drill before drilling. The operations associated with each feature has to be performed in a certain order, i.e., rough milling is always performed before finish milling, to ensure quality and safety are not compromised. Features within a setup may require the same operations (tools) and the operation sequence for a particular tool may involve many features (as illustrated in FIGS. 10 & 11). Our goal is to provide the machinist with a near/optimal operation sequence across features that guarantees quality and safety. To achieve our goal we again utilize an evolutionary program to obtain the operation sequence which best minimizes resources.

If the designer/process planner, once provided a design (machining sequence in terms of operations to be performed), wishes to modify either the setup, feature and/or operation sequence, then the deductive memory compares the rule firing (illustrated in FIG. 12 for the designs in FIGS. 8 & 9) between the provided and modified sequence to update the weights of the relevant rules such that the next time a process design is requested it more closely reflects the modified design. The resultant process design is now stored and clustered in the inductive memory for future retrieval based on similarity of the product design together with associated function, geometric and processing constraints captured in the form of features. This storing of the process design in the inductive memory is one of two mechanisms for coupling the inductive-deductive memory as illustrated in FIG. 3. The second mechanism using rough sets for concept generation is discussed below.

Finally, a concept generation technique is used to identify potentially significant, new knowledge regarding the process design. The approach is to generate new knowledge through analysis of past designs in the associative memory. The knowledge generated by the analysis is provided for use in the deductive memory, thereby coupling the associative and deductive memory. Referring to the flow chart of FIG. 21, the technique involves the use of 'rough sets'—a method for examining the relationships among input parameters and output values for a set of data. This method is particularly well suited to small data sets containing qualitative measures that would be difficult to handle using conventional statistical techniques. Rough sets are of use in obtaining rules about relationships among design attributes and objects.

In the context of optimizing process designs for machined mechanical parts, the concept generation technique is used to determine the degree of certainty with which each part design attribute (feature type, surface area, material, tolerance, etc.) influences the process design (setup sequence, fixturing, feature sequence, and operation sequence). Based on the level of influence, rules are generated from the rough sets using the certainty measures, design objects consisting of attributes. An example analysis is provided in FIGS. 13–16. These relationships are then fed back to the cognitive memory as new knowledge (completing the inductive-deductive coupling as depicted in FIG. 3) for 1) geometric constraints for feature sequencing, 2) resource constraints for operation sequencing, and 3) heuristics for evolutionary operators and providing 'seed' or starting sequences to reduce computation time.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

APPENDIX OF COMPUTER CODE

| | |
|---|---|
| rds_interface_patent.lisp | 7 pages |
| main_ga.c | 2 pages |
| utilities_ga.c | 6 pages |
| main_concept.c | 1 page |
| utilities.c | 4 pages |
| rough_set1.lisp | 3 pages |

```
(in-package 'ws)

(defvar *previous-design-name* "" "Name of the previous part")

;;; Sort based on surface area.   3-29-93
;;; Instead of calculating the distance of a feature from the corner
;;; of the object i'm going to provide the C program with the x,y
;;; coordinates of the center of geometry of the feature.  4-20-93

;;; Gets all features in the part model.
(defun all_features()
  (select :type 'feature-mixin))

;;; Gets the surface area of all the features. Have different calculations depending on the feature type
;;; Modifications performed on April, 13, 93, to account for open steps and steps to shoulders.
(defun surface_area (feat &aux attach)
  (cond
   ((typep feat 'hole)
    (* pi (* (the radius (:from feat)) (the radius (:from feat)))))
   ((typep feat 'open-step-feature)
    (* (the height (:from feat)) (the depth (:from feat))))
   ((typep feat 'open-pocket-feature)
    (setq attach (the attachment-face-list (:from feat)))
    (cond
     ((or (equal attach '(:top :right)) (equal attach '(:top :back)))
      (* (the width (:from feat)) (the depth (:from feat))))
     (t
      (* (the height (:from feat)) (the width (:from feat))))))
   ((typep feat 'perp-aligned-edge-cut-feature)
    (setq attach (the attachment-face-list (:from feat)))
    (cond
     ((equal (nth 0 attach) ':top)
      (* (the width (:from feat)) (the depth (:from feat))))
     (t
      (* (the height (:from feat)) (the depth (:from feat))))))
   (t
    (* (the width (:from feat)) (the depth (:from feat))))))

;;; Gets the critical dimension which is min(width, length) in the case of pockets
;;; or edge cuts.  The critical dimension for a circle is the radius.
(defun critical_dim (feat &aux dim)
  (cond
   ((typep feat 'hole)
    (the radius (:from feat)))
   ((typep feat 'open-step-feature)
    (cond
     ((< (the height (:from feat)) (the depth (:from feat)))
      (the height (:from feat)))
     (t
      (the depth (:from feat)))))
   ((typep feat 'perp-aligned-edge-cut-feature)
    (setf attach (the attachment-face-list (:from feat)))
    (cond
     ((equal (nth 0 attach) ':top)
      (setq dim (the width (:from feat))))
     (t
      (setq dim (the height (:from feat)))))
    (cond
     ((< dim (the depth (:from feat)))
      dim)
     (t
      (the depth (:from feat)))))
   ((typep feat 'open-pocket-feature)
    (cond
     ((< (the width (:from feat)) (the height (:from feat)))
      (the width (:from feat)))
     (t
      (the height (:from feat)))))
   (t
```

```
(cond
 ((< (the depth (:from feat)) (the width (:from feat)))
  (the depth (:from feat)))
 (t
  (the width (:from feat))))))))
```

;;; Maps the feature types. Need to look at this function more carefully. 1/19
```
(defun mapping (feat)
 (cond
  ((typep feat 'pocket-feature) 1)
  ((typep feat 'hole) 2)
  ((typep feat 'PERP-ALIGNED-THROUGH-SLOT-FEATURE) 3)
  ((typep feat 'perp-aligned-edge-cut-feature) 4)
  ((typep feat 'step-to-a-shoulder-feature) 8)
  ((typep feat 'open-step-feature) 9)
  (t 5)))

(defun open_pocket_tst (feat)
  (dd (get-face-geom feat (elt (the attachment-face-list (:from feat)) 0))))
```

;;; Collapsing the 3-D geoms into 2-D.
;;; Using classify Geom to capture the interactions.
;;; May want to used a different methodology, to capture the interactions.
;;; You can't do any translations to the temp-geom, you need to make a copy of it.
;;; temp-geom is just a pointer into the face geom. Translations could be performed
;;; of the copy.
```
(defun interactions_t (feats fp &aux tl acc temp-geom attach trans-geom temp trans_factor geoms)
 (setq tl '())
 (setq acc 0)
 (dolist (feat feats)
         (cond
           ((typep feat 'hole)
            (setq temp-geom (get-face-geom feat :top)))
           ((typep feat 'open-step-feature)
            (setq attach (the attachment-face-list (:from feat)))
            (cond
              ((equal (elt attach 0) :top)
               (setq temp-geom (get-face-geom feat :top)))
              (t
               (setq temp-geom (get-face-geom feat :left)))))
           ((typep feat 'open-pocket-feature)
            (setq attach (the attachment-face-list (:from feat)))
            (setq temp-geom (get-face-geom feat (elt attach 0))))
           ((typep feat 'perp-aligned-edge-cut-feature)
            (setq attach (the attachment-face-list (:from feat)))
            (cond
              ((equal (elt attach 0) :top)
               (setq temp-geom (get-face-geom feat :left-back)))
              (t
               (setq temp-geom (get-face-geom feat :front)))))
           ((typep feat 'step-to-a-shoulder-feature)
            (setq temp-geom (get-face-geom feat :top)))
           ((typep feat 'perp-aligned-through-slot-feature)
            (setq temp-geom (get-face-geom feat :top)))
           (t  ;; For pockets
            (setq temp-geom (get-face-geom feat :top))))
         ;;; (dd temp-geom) draws the geom
         (setq trans-geom (agm::copy-geom temp-geom))
         (setq trans_factor (* -1 (elt (agm::geom-center-of-mass trans-geom) 1)))
         (agm::translate-geom trans-geom (list 0.0 trans_factor 0.0))
         ;;;(dd trans-geom)
         (setq tl (append tl (list trans-geom)))
 )
 (setq feats tl)
 (setq temp (cdr feats))
 (dolist (feat feats)
         (dolist (f2 temp)
                 (setq geoms (agm::classify-geoms (agm::copy-geom feat) (agm::copy-geom f2)
                                                 '(:in :out) '()))
```

```
                    (format nil "~b ~%" geoms)
                  (cond
                    ((equal (agm::geom-type (car geoms)) ':xnullgeom)
                     (format fp "~3,1F ~%"
                             0.0))
                    (t
                     (cond
                       ((equal (agm::geom-type (nth 2 geoms)) ':xnullgeom)
                        (format fp "~3,1F ~%"
                                1.0))
                       (t
                        (format fp "~3,1F ~%"
                                0.5))))))
           (setq temp (cdr temp))))

;;; The following function is different from interactions_t in that it
;;; doesn't assume that the features are sorted based on the surface area.

(defun interactions_unordered (feats fp &aux tl accte temp-geom attach trans-geom trans_factor temp)
  (setq tl '())
  (setq acc 0)
  (dolist (feat feats)
          (cond
            ((typep feat 'hole)
             (setq temp-geom (get-face-geom feat :top)))
            ((typep feat 'open-step-feature)
             (setq attach (the attachment-face-list (:from feat)))
             (cond
               ((equal (elt attach 0) :top)
                (setq temp-geom (get-face-geom feat :top)))
               (t
                (setq temp-geom (get-face-geom feat :left)))))
            ((typep feat 'open-pocket-feature)
             (setq attach (the attachment-face-list (:from feat)))
             (setq temp-geom (get-face-geom feat (elt attach 0))))
            ((typep feat 'perp-aligned-edge-cut-feature)
             (setq attach (the attachment-face-list (:from feat)))
             (cond
               ((equal (elt attach 0) :top)
                (setq temp-geom (get-face-geom feat :left-back)))
               (t
                (setq temp-geom (get-face-geom feat :front)))))
            ((typep feat 'step-to-a-shoulder-feature)
             (setq temp-geom (get-face-geom feat :top)))
            ((typep feat 'perp-aligned-through-slot-feature)
             (setq temp-geom (get-face-geom feat :top)))
            (t     ;; For pockets
             (setq temp-geom (get-face-geom feat :top))))
          ;;; (dd temp-geom) draws the geom
          (setq trans-geom (agm::copy-geom temp-geom))
          (setq trans_factor (* -1 (elt (agm::geom-center-of-mass trans-geom) 1)))
          (agm::translate-geom trans-geom (list 0.0 trans_factor 0.0))
          ;;;(dd trans-geom)
          (setq tl (append tl (list trans-geom)))
          )
  (setq feats tl)
  (setq temp (cdr feats))
  (dolist (feat feats)
          (dolist (f2 temp)
                  (cond
                    ((agm::intersecting-geoms-p feat f2 0.005)   ;;; They intersect check if we have total or partial
                     (setq geoms (agm::classify-geoms (agm::copy-geom feat) (agm::copy-geom f2)
                                                     '(:out) '(:out)))   ;;; If one of them is contained in the other then total
                     (cond
                       ((or (equal (agm::geom-type (nth 2 geoms)) ':xnullgeom) (equal (agm::geom-type (nth 5 geoms)) ':xnullgeom))
                        (format fp "~3,1F ~%"
                                1.0))
                       (t
                        (format fp "~3,1F ~%"
                                0.5)))   ;;; Both geoms have parts outside the intersection area so we have partial intersection
```

```
                )
                (t
                  (format fp "~3,1F ~%"
                        0.0))))
          (setq temp (cdr temp))))
```

```
;;; Returns true if the feature tested is a starting block.
(defun typestrt (feat)
                    (typep feat 'starting-block-class))
```

```
;;; read-from-string a lisp function that reaturns an integer in this case.
;;; pop-up-typein-read creates a dialog window that is used to enter the number of iterations.
(defun num_iterations (fp)
  (setf num (read-from-string (pop-up-typein-read "How many iterations do you wish to let the program run ?")))
  (format fp "~D~%" num))
```

```
(defun material_hardness ()
  (rds-menu-choose '(("Hard Material" :value 1)
                          ("Soft Material" :value 2)))
)
```

```
(defun tolerances ()
  (rds-menu-choose '(("High (Tight) Tolerances" :value 1)
                         ("Low Tolerances" :value 2))))
```

```
(defun eval_method ()
  (rds-menu-choose '(("Safety the driving criteria" :value 1)
                         ("Minimizing Tool changes the driving Criteria" :value 2)
                         ("Minimizing Distance the driving criteria" :value 3)
                         ("Largest Surface Areas first" :value 4)
                         ("Automatic" :value 5))))
```

```
;;; Determine which evaluation function to use based on the machinist choice
;;; If the material is soft and tolerances are low then do the largest surface
;;; areas first. */
```

```
(defun choices_func (fp &aux n3 n1 n2)
 (setq n3 (eval_method))
 (cond
  ((equal n3 5)
   (setq n1 (material_hardness))
   (setq n2 (tolerances))
   (cond
    ((and (equal n1 2) (equal n2 2))
     (format fp "~ D ~%" 4))
    (t
     (format fp "~D~%" 1))))
  (t
   (format fp "~D~%" n3))))
```

```
;;; This function calculates the distance a feature is from the left corner of the
;;; front face of the object.
(defun relative_dist (feat depth width dx dz &aux x z dist)
  (setq x (+ width dx))
  (setq z (- depth dz))   ;; Translate the center of the object center of the front face
  (setq dist (sqrt (+ (* x x) (* z z))))
)
```

```
(defun get-feature-seq (&aux type prompt exclude obj-list ordered-feat-list len feat)
 (prog user-seq
      (setq type 'feature-mixin)
      (setq prompt "to be machined next")
      (setq exclude '(starting-block-class))
      (setq obj-list (remove-if #'typestrt (select :type type)))
      (setq obj-list (remove-if-not 'colon-drawable obj-list))
```

```
            (setq ordered-feat-list '())
            (setq len (length obj-list))
            (dotimes (i len)
                    (setq feat (do ((obj (get-instance prompt) (get-instance prompt)))
                                    ((member obj obj-list) obj)))
                    (setq obj-list (remove feat obj-list))
                    (setq ordered-feat-list (append ordered-feat-list (list feat)))
                    )
            (return ordered-feat-list))
)

(defun main_f(&aux d w feats c-list len center-geom dx dy dz)
    (setq d (/ (the depth (:from (the part-model))) 2))  ;;; used by relative distance.
    (setq w (/ (the width (:from (the part-model))) 2))  ;;; used by relative distance.
    (setq c-list '())    ;;; center of geom list
    (with-open-file (fp "input.dat"
                        :direction :output
                        :if-exists :supersede
                        :if-does-not-exist :create)
            (num_iterations fp)
            (choices_func fp)
            (format fp "~S~%" (the name (:from (the part-model))))
;;; Get all the features in the part model and remove the starting block
            (setq feats (remove-if #'typestrt (all_features)))
;;; Recalculate the surface areas.  Consider the surface area of the top face.
            (dolist (feat feats)
                    (change (the surface-area (:from feat)) (surface_area feat)))
;;; Sort the features according to surface area.
            (setq feats (sort feats #'< :key #'(lambda (e)
                                                (the surface-area (:from e)))))
            (setq len (length feats))
            (format fp "~d~%" len)
            (dolist (feat feats)
                    (setq center-geom (agm::geom-center-of-mass (the geom (:from feat))))
                    (setq dx (nth 0 center-geom))
                    (setq dy (nth 2 center-geom))
                    ;; (setq dz (nth 1 center-geom))
                    ;; (setq c-list (append c-list (list dz)))
                    (format fp "~D~%" (mapping feat))
                    (format fp "~6,2F~%" (the surface-area (:from feat)))
                    (format fp "~6,2F~%" (critical_dim feat))
                    (format fp "~6,2F~%" (+ w dx))   ;;; Offset from one of the corners.
                    (format fp "~6,2F~%" (+ d dy))
                    (format fp "~S~%" (the slot-name (:from feat))))
            (interactions_t feats fp)
))

(defun user_def_seq (&aux d w feats c-list len center-geom dx dy dz)
    (setq d (/ (the depth (:from (the part-model))) 2))  ;;; used by relative distance.
    (setq w (/ (the width (:from (the part-model))) 2))  ;;; used by relative distance.
    (setq c-list '())    ;;; center of geom list
    (with-open-file (fp "user_seq.dat"
                        :direction :output
                        :if-exists :supersede
                        :if-does-not-exist :create)
            (choices_func fp)
            (format fp "~S~%" (the name (:from (the part-model))))
;;; Get all the features in the part model and remove the starting block
            (setq feats (get-feature-seq))
;;; Recalculate the surface areas.  Consider the surface area of the top face.
            (dolist (feat feats)
                    (change (the surface-area (:from feat)) (surface_area feat)))
;;; Sort the features according to surface area.
            (setq len (length feats))
            (format fp "~d~%" len)
            (dolist (feat feats)
                    (setq center-geom (agm::geom-center-of-mass (the geom (:from feat))))
                    (setq dx (nth 0 center-geom))
                    (setq dy (nth 2 center-geom))
```

```lisp
        ;; (setq dz (nth 1 center-geom))
        ;; (setq c-list (append c-list (list dz)))
          (format fp "~D~%" (mapping feat))
          (format fp "~6,2F~%" (the surface-area (:from feat)))
          (format fp "~6,2F~%" (critical_dim feat))
          (format fp "~6,2F~%" (+ w dx))  ;;; Offset from one of the corners.
          (format fp "~6,2F~%" (+ d dy))
          (format fp "~S~%" (the slot-name (:from feat))))
      (interactions_unordered feats fp)
))

(defun name_slot (feat)
  (the slot-name (:from feat)))

(defun display_seq (&aux num-rules foo names input-stream num-feat feats rules pos)
  (setq num-rules 14)
  (setq foo (all_features))
  (setq names (mapcar #'name_slot foo))
  (setq input-stream (open "output.dat" :direction :input))
  (setq num-feat (read input-stream))
  (setq feats (loop as i from 1 to num-feat
                    append
                    (list (read input-stream))))
  (setq rules (loop as i from 1 to num-rules
                    append
                    (list (read input-stream))))
  (close input-stream)
  (display_rules rules)
  (pop-up-message (format nil "The best sequence found is: ~%~a" feats :character-wide 20))
  (dolist (feat feats)
          (setq pos (position feat names))
          (blink-object (nth pos foo) 3))
)

(defun display_user_rules(&aux num-rules input-stream rules )
  (setq num-rules 14)
  (setq input-stream (open "user_seq_rules.dat" :direction :input))
  (setq rules (loop as i from 1 to num-rules
                    append
                    (list (read input-stream))))
  (close input-stream)
  (display_rules rules)
)

(defun generate_input_file ()
  (main_f)
  (setf *previous-design-name* (the name (:from (the part-model))))
)

(defun run(&aux choice)
  (cond
    ((or (equal *previous-design-name* nil) (not (equal *previous-design-name* (the name (:from (the part-model))))))
     (generate_input_file))
    (t
     (setq choice (rds-menu-choose '(("Change the number of iterations, and/or criteria" :value 1)
                                     ("No changes" :value 2))))
     (if (equal choice 1)
         (main_f))
    )
  )
  (setf choice (rds-menu-choose '(("G.A. (version 1)" :value 1)
                                  ("G.A. (version 2)" :value 2)
                                  ("G.A. (version 1, with simulated annealing)" :value 3)
                                  ("G.A. (version 2, with simulated annealing)" :value 4)
                                  ("E.S.A. (version 1)" :value 5)
                                  ("E.S.A. (version 2)" :value 6)
                                  ("Invoke the memory * NOT IMPLEMENTED YET *":value 7))))
```

```
(cond
  ((equal choice 1)
   (lcl::shell "~/semi_finished/feature_sequencing_rds/GA")
   (display_seq))
  ((equal choice 2)
   (lcl::shell "~/semi_finished/feature_sequencing_rds/GA2")
   (display_seq))
  ((equal choice 3)
   (lcl::shell "~/semi_finished/feature_sequencing_rds/GASA")
   (display_seq))
  ((equal choice 4)
   (lcl::shell "~/semi_finished/feature_sequencing_rds/GASA2")
   (display_seq))
  ((equal choice 5)
   (lcl::shell "~/semi_finished/feature_sequencing_rds/ESA")
   (display_seq))
  ((equal choice 6)
   (lcl::shell "~/semi_finished/feature_sequencing_rds/ESA2")
   (display_seq))
  (t
   (pop-up-message (format nil "I warned you, my memory is blank")))
  )
)

(defun run_user_seq ()
  (user_def_seq)
  (lcl::shell "~/semi_finished/feature_sequencing_rds/SI")
  (display_user_rules))
```

```c
#include <stdio.h>
#include <time.h>
#include <limits.h>
#include "data_struct.h"
#include "global.h"
#include "variables.h"

main(argc, argv)
    int argc;
    char **argv;
{
    struct Sem_Mem *head, *tail;
    Search_Pat *choices, *population;
    struct Mem_Vector *mem_vec_head = NULL, *temp;
    int T_Accpt, T_Points, num_population, num_itr, priority_choice;
    int i = 1, flag = 1,m,j,num_intr_cells=0,k=1,acc=0,itr, im, temp_p, tot_pop;
    int temp_next; /* Store the number of children in the next generation */
    char fname[20], part_name[20];
    FILE *fp, *fp_dbase, *fp_stat;
    Family_Struct *families;
    long rand_t;
    clock_t start_time, finish_time;
    double run_time;
    float temper,rnd, total_lval, global_min_lval;
    int multiplier = 10;   /* The multiplier that the num_feat is multiplied by to get the number of the population */
    Assoc_Table *table;
    /* To generate a seed used by the random number generator */
    struct tm *T=(struct tm*)malloc(sizeof(struct tm));
    time_t *C=(time_t*)malloc(sizeof(time_t));

start_time = clock();
    time(C);
    T=localtime(C);
    rand_t = T->tm_sec + T->tm_min + T->tm_hour + T->tm_mday + T->tm_mon + T->tm_year + random();
    rand_t = srandom(rand_t);
    fp = fopen("input.dat", "r");
    fscanf(fp,"%i",&num_itr);
    fscanf(fp,"%i",&priority_choice);
    fscanf(fp,"%s",part_name);
    fscanf(fp,"%i",&Num_Feat);

read_in_wts(priority_choice);

/* Allocate space for table entries */
    table = (Assoc_Table *) calloc (Num_Feat, sizeof(Assoc_Table));

choices = (Search_Pat *) define_pat(feature_types,fp,table);   /*Choose the pattern you are looking for */

/* Loop to determine the number of elements in the interaction matrix.
            The interaction matrix is an upper triangular matrix with 0 on the
            diagonal. This matrix is linearized here to save storage space.
            The number of elements in this matrix is equal to sum(i) where
            i = 1 to (Num_Feat - 1). E.g. for 5 features we need a matrix with
            10 cells (4+3+2+1). */
    for (i=1; i<Num_Feat; i++)
        num_intr_cells += i;

choices->intr_mtrx = (float *) calloc (num_intr_cells, sizeof(float)); /* allocate space for the interaction matrix */ for (i=0; i<Num_Feat; i++)
    {
            for (j = (i+1); j<Num_Feat; j++)
            {
                fscanf(fp, "%f",&choices->intr_mtrx[acc]);
                acc++; /* Index into the interaction table */
            }
    } fclose(fp);
```

```c
    distance_scaling_factor (choices->x_y_coord, &Dist_Factor);   /* calculate the distance scaling factor */ fp_stat = fopen("stat_ga.dat", "a");
    fprintf (fp_stat,"\n \n -------------------------------- GA -------------------------------- \n");
    fprintf (fp_stat,"Part Name : %s , Number of generations = %d \n",part_name, num_itr);
    fprintf (fp_stat,"generation \t  Minimum \t\t  Average \n");

tot_pop = Num_Feat * multiplier;

for (itr = 0; itr<num_itr ; itr++)
        {
                if (!(itr))
                  {
                    /* The parents are effectively where the population is stored */
                    population = (Search_Pat *) generate_pop(choices, num_intr_cells, tot_pop, priority_choice);
                    num_population = Num_Feat;
                  }
                else
                  {
                    im = random()%100;
                    if (im > 10)  /* 10 percent mutation rate */
                      if (im <= 20)
                            invert_pop(population, tot_pop, priority_choice);
                      else
                            reproduce(population, tot_pop, priority_choice);
                    else
                      mutate_pop(population, tot_pop, priority_choice);

if ((!(itr % 10)) || (itr == (num_itr-1)))  /* do the statistics for every ten iterations */
                      {
                            total_lval = population[0].l_val;
                            global_min_lval = population[0].l_val;
                            for (i=1; i<tot_pop; i++)
                              {
                                total_lval += population[i].l_val;
                                if (population[i].l_val < global_min_lval)
                                  global_min_lval = population[i].l_val;
                              }
                            fprintf(fp_stat, "%d \t\t %f \t\t %f \n",itr, global_min_lval, (total_lval/tot_pop));
                      }
                  }
        } finish_time = clock();
    run_time = ((double) (finish_time - start_time)) / CLOCKS_PER_SEC;
    fprintf(fp_stat,"*********** Run time = %f *********** \n \n", run_time);
    m = tot_pop - 1;
    qsort(population,0,m);
    print_table(table);
    fp_dbase = fopen("dbase_ga1.dat","a");
    fprintf (fp_dbase, "\n \n \n -------------------------------- ** GA ** -------------------------------- \n");
    fprintf(fp_dbase, "\n \t The part name is  %s \n",part_name);
    fprintf(fp_dbase, " The best solutions found for %s after %d iterations are :\n",part_name, num_itr);
    print_dbase(population, table, num_population, part_name, m, fp_dbase);
    /* m = min_index(population,num_population); */
    print_table(table);
    fprintf(fp_dbase, "\n ***** The best sequence is stored at position %d \n",(Num_Feat*multiplier)-1);
    print_seq(population,m,table,part_name,fp_dbase);
    free(choices);
    fclose(fp_stat);
    fclose(fp_dbase);
}
```

```c
#include <stdio.h>
#include "data_struct.h"

extern int Num_Feat;
extern int Num_SB_Req ;

extern Safety_Rules s_r_wts;
extern Tool_CT_Min_Rules t_c_wts, t_t_wts;
extern LSAF_Rules l_sa_wts;

void swap(parents, i, j)
Search_Pat *parents;
int i,j;
{
 Search_Pat temp;
 temp = parents[i];
 parents[i] = parents[j];
 parents[j] = temp;
} void qsort(population, left, right)
Search_Pat *population;
int left, right;
{
 int i,last;
 /* do nothing if we have less than two elements */
 if (left >= right)
   return ;
 swap(population, left, (left+right)/2);
 last = left;
 for (i = left+1; i<=right; i++)
   if (population[left].l_val < population[i].l_val) /* Store in decreasing order, best sequences at end */
     swap(population, ++last, i);
 swap(population, left, last);
 qsort(population, left, last-1);
 qsort(population, last+1, right);
}

/* It is too expensive and time consuming to do floating point operations */
float pop_total(pop, num_pop)
Search_Pat *pop;
int num_pop;
{
 int tot = 0;
 int i;
 for (i=0; i<num_pop; i++)
   {
     if (pop[i].l_val < 0)
           tot += pop[i].l_val * -10;
     else
           tot += pop[i].l_val * 0.1;
   }
 return(tot);
} int roulette_selection (pop, num_pop, total)
Search_Pat *pop;
int num_pop, total;
{
 int choosen_rnd, i=0, temp=0;
 choosen_rnd = random() % total;
 while ((i<num_pop) && (temp<choosen_rnd))
   {
     if (pop[i].l_val < 0)
           temp += pop[i].l_val * -10;
     else
           temp += pop[i].l_val * 0.1;
     i++;
```

```
        }
    if (i == num_pop)  i = random() % num_pop;
    return(i);
} void read_in_wts(choice)
int choice;
{
  FILE *fp;
  fp = fopen ("rule_weights.dat","r");
  fscanf(fp, "%f", &s_r_wts.inter_ec_first);
  fscanf(fp, "%f", &s_r_wts.two_ec_inseq_sim1);
  fscanf(fp, "%f", &s_r_wts.two_ec_inseq_sim5);
  fscanf(fp, "%f", &s_r_wts.ti_large_first);
  fscanf(fp, "%f", &s_r_wts.ti_small_first);
  fscanf(fp, "%f", &s_r_wts.ti_sim1_ft_same_inseq);
  fscanf(fp, "%f", &s_r_wts.ti_sim1_ft_diff_inseq);
  fscanf(fp, "%f", &s_r_wts.ti_sim5_ft_same_inseq);
  fscanf(fp, "%f", &s_r_wts.ti_sim5_ft_diff_inseq);
  fscanf(fp, "%f", &s_r_wts.ti_sim0_inseq);
  fscanf(fp, "%f", &s_r_wts.pi_large_first);
  fscanf(fp, "%f", &s_r_wts.pi_small_first);
  fscanf(fp, "%f", &s_r_wts.pi_sim1_ft_same_inseq);
  fscanf(fp, "%f", &s_r_wts.pi_sim1_ft_diff_inseq);
  fscanf(fp, "%f", &s_r_wts.pi_sim5_ft_same_inseq);
  fscanf(fp, "%f", &s_r_wts.pi_sim5_ft_diff_inseq);
  fscanf(fp, "%f", &s_r_wts.pi_sim0_inseq);
  fscanf(fp, "%f", &s_r_wts.ni_sim1_ft_same_inseq);
  fscanf(fp, "%f", &s_r_wts.ni_sim1_ft_diff_inseq);
  fscanf(fp, "%f", &s_r_wts.ni_sim5_ft_same_inseq);
  fscanf(fp, "%f", &s_r_wts.ni_sim5_ft_diff_inseq);
  fscanf(fp, "%f", &s_r_wts.ni_sim0_inseq);
  fscanf(fp, "%f", &t_c_wts.sim1_ft_same_inseq);
  fscanf(fp, "%f", &t_c_wts.sim1_ft_diff_inseq);
  fscanf(fp, "%f", &t_c_wts.sim5_ft_same_inseq);
  fscanf(fp, "%f", &t_c_wts.sim5_ft_diff_inseq);
  fscanf(fp, "%f", &t_c_wts.sim0_inseq);
  fscanf(fp, "%f", &t_t_wts.sim1_ft_same_inseq);
  fscanf(fp, "%f", &t_t_wts.sim1_ft_diff_inseq);
  fscanf(fp, "%f", &t_t_wts.sim5_ft_same_inseq);
  fscanf(fp, "%f", &t_t_wts.sim5_ft_diff_inseq);
  fscanf(fp, "%f", &t_t_wts.sim0_inseq);
  fscanf(fp, "%f", &l_sa_wts.large_sa_first);
  fscanf(fp, "%f", &l_sa_wts.small_sa_first);

}

/* Calculates the factorial of Num */
long factorial (Num)
int Num;
{
  int i;
  long fac = Num;
  if (!Num) return 1;
  for (i=(Num-1); i>1; i--) fac = fac*i;
  return fac;
} void reset_chosen(pat)
Search_Pat *pat;
{
  int i;
  for (i=0; i<Num_Feat; i++)
    pat->chosen[i].bit = 0;
}

/* Factor = (sum (distance_from_00(feat[i])), for i = 1 to num_feat */
void distance_scaling_factor (coords, factor)
Coordinate *coords;
float *factor;
```

```c
{
  float dist = 0;
  int i;
  for (i=0; i<Num_Feat; i++)
    dist += (coords[i].xc * coords[i].xc) + (coords[i].yc * coords[i].yc);
  *factor = (dist/2.0);

}

/* Given the number of two interacting features this procedure will produce
    the offset into the interaction table that correspond to the way the two
    features interact. */
int deter_offset(row, col)
int row, col;
{
  int index = 0, offset, i;
  /* calculate the starting point for elements in the row */
  for(i=0; i<row; i++)
    index += (Num_Feat - i - 1);

offset = (col - row) - 1;

return( index+offset );

}

/* Find the minimum liapunov value, returns the index to the
    sequence that has the smallest liapunov value. */ int min_index(opt_seq, num)
Search_Pat *opt_seq;
int num;
{
  float min;
  int i, index=0;
  min = opt_seq[0].l_val;
  for (i=1; i<num ; i++)
    {
      if (opt_seq[i].l_val < min)
          {
            index = i;
            min = opt_seq[i].l_val;
          }
    }
  return index;
} int find_index_table(ft,fn,table)
char ft;
int fn;
Assoc_Table *table;
{
  int i=0,flg =1;
  while ((table[i].features.feat_type != ft) || (table[i].features.feat_no != fn))
          i++;
return i;
} void print_table(table)
Assoc_Table *table;
{
  int i;
  for (i=0; i<Num_Feat; i++)
    printf("%s \t %c%d \n",table[i].name_arr, table[i].features.feat_type, table[i].features.feat_no);
} void print_rule_counters (gpat, index, fp)
Search_Pat *gpat;
int index;
```

```c
FILE *fp;
{
  Search_Pat *pat = &gpat[index];
/* printf ("The edge cut machined first (punish) : %d\n", pat->rules_cntr->ec_wrong_order);
   printf ("The two edge cuts will probably use the same tool: %d \n", pat->rules_cntr->ec_same_tool);
   printf ("The two edge cuts may use the same tool : %d \n", pat->rules_cntr->ec_may_same);
   printf ("Features are sequenced in the wrong order (Saftey, Punish) : %d \n",pat->rules_cntr->feat_wr_seq);
   printf ("Features are sequenced in the right order (Saftey, Total) : %d \n", pat->rules_cntr->feat_right_seq_tot);
   printf ("Features are sequenced in the right order (Saftey, Partial) : %d \n", pat->rules_cntr->feat_right_seq_par);
   printf ("Do feature that is close to the origin first : %d \n", pat->rules_cntr->feat_short_first);
   printf ("Do feature that is far from the origin first (Punish) : %d \n", pat->rules_cntr->feat_long_first);
   printf ("It is highly likely that the features will use same tool (Sim = 1, same type) : %d \n" ,
            pat->rules_cntr->feat_same_tool);
   printf ("It is likely that the features will use same tool (Sim = 1, different type) %d \n" ,
            pat->rules_cntr->feat_likely_st);
   printf ("The features might use the same tool (Sim = .5, same type) %d \n" , pat->rules_cntr->feat_s_s);
   printf ("There is a small chance that the features will use the same tool (Sim = .5, different type) : %d \n",
            pat->rules_cntr->feat_s_d);
   printf ("Do large surface area first : %d \n", pat->rules_cntr->large_surf_first);
   printf ("Do small surface area first : %d , l_val = %f \n", pat->rules_cntr->small_surf_first, pat->l_val);
*/ fprintf(fp, "%d \t", pat->rules_cntr->ec_wrong_order);
  fprintf(fp, "%d \t",  pat->rules_cntr->ec_same_tool);
  fprintf(fp, "%d \t",pat->rules_cntr->ec_may_same);
  fprintf(fp, "%d \t",pat->rules_cntr->feat_wr_seq);
  fprintf(fp, "%d \t", pat->rules_cntr->feat_right_seq_tot);
  fprintf(fp, "%d \t", pat->rules_cntr->feat_right_seq_par);
  fprintf(fp, "%d \t", pat->rules_cntr->feat_short_first);
  fprintf(fp, "%d \t", pat->rules_cntr->feat_long_first);
  fprintf(fp, "%d \t", pat->rules_cntr->feat_same_tool);
  fprintf(fp, "%d \t", pat->rules_cntr->feat_likely_st);
  fprintf(fp, "%d \t", pat->rules_cntr->feat_s_s);
  fprintf(fp, "%d \t", pat->rules_cntr->feat_s_d);
  fprintf(fp, "%d \t", pat->rules_cntr->large_surf_first);
  fprintf(fp, "%d \t", pat->rules_cntr->small_surf_first);

} void print_seq(sequence, index, table, p_name,fp_dbase, run_time)
Search_Pat *sequence;
int index;
Assoc_Table *table;
FILE *fp_dbase;
char *p_name;
double run_time;
{
  int i,j;
  FILE *fp, *fp1;
  fp = fopen("output.dat","w");
  fp1 = fopen ("test_set.dat", "a");
  fprintf(fp_dbase, "%s     Run Time = %f \t", p_name, run_time);
  fprintf(fp,"%d \n",Num_Feat);
  for (i=0; i<Num_Feat; i++)
   {
     j = find_index_table(sequence[index].feat_type[i],sequence[index].feat_no[i], table);
     fprintf(fp,"%s \t",table[j].name_arr);
     fprintf(fp1, "%d ",j);  /* print out the order the feature was entered in, a way of encoding the output */
     fprintf(fp_dbase,"%s \t",table[j].name_arr);
   }
  fprintf(fp,"\n");   /* go to a new line */
  print_rule_counters(sequence, index, fp);
  printf("fitness value = %f \n", sequence[index].l_val);
  fprintf(fp1,"\n");  /* go to a new line */
  fclose(fp);
  fclose(fp1);
} void print_dbase(sequence, table, num_parents, p_name, top_index, fp_dbase)
```

```
Search_Pat *sequence;
int num_parents, top_index;
Assoc_Table *table;
FILE *fp_dbase;
char *p_name;
{
 int i,j,ii;
 for (ii= top_index ; ii > (top_index-num_parents) ; ii--)
   {
     for (i=0; i<Num_Feat; i++)
         {
           j = find_index_table(sequence[ii].feat_type[i],sequence[ii].feat_no[i], table);
           fprintf(fp_dbase,"%s \t",table[j].name_arr);
         }
     fprintf(fp_dbase, "l_val = %f\n",sequence[ii].l_val);
     /* print_rule_counters(sequence, ii, fp_dbase); */
   }
}

/* find the position of feature child1[index] in child2 */
int find_feat (child1, index, child2)
str *child1, *child2;
int index;
{
 int i=0;
 while (!((child1[index].feat_type == child2[i].feat_type) &&
           (child1[index].feat_no == child2[i].feat_no)) && (i < Num_Feat))
   i++;
return i;
} void swap_feat(ind1, ind2, child)
int ind1, ind2;
str *child;
{
 int n;
 char c;
 n = child[ind1].feat_no;
 c = child[ind1].feat_type;
 child[ind1].feat_no = child[ind2].feat_no;
 child[ind1].feat_type = child[ind2].feat_type;
 child[ind2].feat_no = n;
 child[ind2].feat_type = c;
} int *create_index_table(old, new)
str *old,*new;
{
 int i,j;
 int *index_table = (int *) calloc (Num_Feat, sizeof(int));
 for (i=0; i<Num_Feat; i++)
   {
     j=0;
     while (!((old[i].feat_type == new[j].feat_type) &&
              (old[i].feat_no == new[j].feat_no)))
         j++;
     index_table[j] = i;
   }
 return index_table;
} float *mutate_surf_area(surf_area, i_t)
float *surf_area;
int *i_t;
```

```c
{
  float *temp = (float *) calloc(Num_Feat, sizeof(float));
  int i;
  for (i=0; i<Num_Feat; i++)
    temp[i] = surf_area[i_t[i]];
  return temp;
} float *mutate_critical_dim (critical_dim, i_t)
float *critical_dim;
int *i_t;
{
  float *temp = (float *) calloc(Num_Feat, sizeof(float));
  int i;
  for (i=0; i<Num_Feat; i++)
    temp[i] = critical_dim[i_t[i]];
  return temp;
}

Coordinate *mutate_coord(x_y_coord, i_t)
Coordinate *x_y_coord;
int *i_t;
{
  Coordinate *temp = (Coordinate *) calloc(Num_Feat, sizeof(Coordinate));
  int i;
  for (i=0; i<Num_Feat; i++)
    {
      temp[i].xc = x_y_coord[i_t[i]].xc;
      temp[i].yc = x_y_coord[i_t[i]].yc;
    }
  return temp;
} void replace (child, pt_c, pop, pt_p, num_intr)
Search_Pat *child, *pop;
int pt_c, pt_p, num_intr;
{
  int i;
  for (i=0; i<Num_Feat; i++)
    {
      pop[pt_p].feat_type[i] = child[pt_c].feat_type[i];
      pop[pt_p].feat_no[i] = child[pt_c].feat_no[i];
      pop[pt_p].surf_area[i] = child[pt_c].surf_area[i];
      pop[pt_p].critical_dim[i] = child[pt_c].critical_dim[i];
      pop[pt_p].x_y_coord[i].xc = child[pt_c].x_y_coord[i].xc;
      pop[pt_p].x_y_coord[i].yc = child[pt_c].x_y_coord[i].yc;
    }
  for (i=0; i<num_intr; i++)
    pop[pt_p].intr_mtrx[i] = child[pt_c].intr_mtrx[i];

pop[pt_p].l_val = child[pt_c].l_val;

/* Could simply set pop[pt_p].rules_cntr = child[pt_c].rules_cntr, but just as a precaution
     i am setting every value individually */ pop[pt_p].rules_cntr->ec_wrong_order = child[pt_c].rules_cntr->ec_wrong_order;
  pop[pt_p].rules_cntr->ec_same_tool = child[pt_c].rules_cntr->ec_same_tool;
  pop[pt_p].rules_cntr->ec_may_same = child[pt_c].rules_cntr->ec_may_same;
  pop[pt_p].rules_cntr->feat_wr_seq = child[pt_c].rules_cntr->feat_wr_seq;
  pop[pt_p].rules_cntr->feat_right_seq_tot = child[pt_c].rules_cntr->feat_right_seq_tot;
  pop[pt_p].rules_cntr->feat_right_seq_par = child[pt_c].rules_cntr->feat_right_seq_par;
  pop[pt_p].rules_cntr->feat_short_first = child[pt_c].rules_cntr->feat_short_first;
  pop[pt_p].rules_cntr->feat_long_first = child[pt_c].rules_cntr->feat_long_first;
  pop[pt_p].rules_cntr->feat_same_tool = child[pt_c].rules_cntr->feat_same_tool;
  pop[pt_p].rules_cntr->feat_likely_st = child[pt_c].rules_cntr->feat_likely_st;
  pop[pt_p].rules_cntr->feat_s_s = child[pt_c].rules_cntr->feat_s_s;
  pop[pt_p].rules_cntr->feat_s_d = child[pt_c].rules_cntr-> feat_s_d;
  pop[pt_p].rules_cntr->large_surf_first = child[pt_c].rules_cntr->large_surf_first;
  pop[pt_p].rules_cntr->small_surf_first = child[pt_c].rules_cntr->small_surf_first;
```

```
#include <stdio.h>
#include "data_struct.h"

/* Main for the concept memory program */ main()
{
  Data_Struct_Ptr main_struct;
  Input_Data *d_s;
  char temp[25];
  int num_attr, num_out_c;
  Feature_Group *f_g;
  Index_Table *ot;
  printf("Enter the name of the input file name : ");
  scanf("%s",temp);
  printf("Enter the number of attributes : ");
  scanf ("%d",&num_attr);
  d_s = (Input_Data *) readin(temp,num_attr,&main_struct.fg_ptr,&ot);
  num_out_c = get_num_classes(ot);
  deter_stren_of_act_wts(d_s, main_struct.fg_ptr, num_attr, num_out_c);
  deter_atten_wts(main_struct.fg_ptr, num_out_c);
  conjunct_attr (&main_struct.cfg_ptr, main_struct.fg_ptr, d_s, num_attr, num_out_c);
  deter_conj_atten_wts(main_struct.cfg_ptr, num_out_c);
  print_concepts_discovered (main_struct.cfg_ptr, num_out_c, num_attr, ot);
  predict_out_class(main_struct.fg_ptr, main_struct.cfg_ptr, num_out_c, num_attr, ot);
}
```

```c
#include <stdio.h>
#include <string.h>
#include <math.h>
#include "data_struct.h"

/* Utility functions for the concept memory program */

Feature_Group *tail_group_list(f_g)
    Feature_Group *f_g;
{
  while (f_g->next)
    f_g = f_g->next;
  return(f_g);
}

Feature_Node *tail_node_list(f_n)
    Feature_Node *f_n;
{
  while (f_n->next)
    f_n = f_n->next;
  return(f_n);
} int create_entry(table, c_name)
Index_Table *table;
char *c_name;
{
  table->class = 0;  /* start with class 0 */
  strncpy(table->class_name,c_name, strlen(c_name));
  table->next = NULL;
  return(table->class);
} char *find_entry (table, c_num)
    Index_Table *table;
    int c_num;
{
  int f_flg = 0;
  while (!f_flg)
    {
      if (table->class == c_num)
            return(table->class_name);
      table = table->next;
    }
} int find_create(table, c_name)
Index_Table *table;
char *c_name;
{
  int max_class = 0, f_flg = 0;  /*f_flg = found flag */
  Index_Table *temp_ptr = table;
  while (temp_ptr && (!(f_flg)))
    {
      if (!strcmp(temp_ptr->class_name, c_name))  /* strings equal */
            f_flg = (1 + temp_ptr->class);  /* To deal with the case of the class being equal to zero */
      else
            {
              if (max_class < temp_ptr->class)
                max_class = temp_ptr->class;
              temp_ptr = temp_ptr->next;
            }
    }
  if (f_flg)  /* the class already exists */
    return((f_flg-1));
  /* Need to add a new entry to table we have, go to the end of the list */
  temp_ptr = table;
  while (temp_ptr->next)
    temp_ptr = temp_ptr->next;
  temp_ptr->next = (Index_Table *) malloc (sizeof(Index_Table));
```

```c
    temp_ptr->next->class = max_class + 1;
    strncpy(temp_ptr->next->class_name,c_name, strlen(c_name));
    temp_ptr->next->next = NULL;
    return(max_class+1);
} int code_entry(table, c_name)
Index_Table *table;
char *c_name;
{
 int f_flg = 0;   /*f_flg = found flag */
 Index_Table *temp_ptr = table;
 while (temp_ptr && (!(f_flg)))
   {
     if (!strcmp(temp_ptr->class_name, c_name))   /* strings equal */
            return(temp_ptr->class);
     printf("The class name %s \n", temp_ptr->class_name);
     temp_ptr = temp_ptr->next;
   }
} void print_struct(d_s, num_attr)
    Input_Data *d_s;
    int num_attr;
{
 int i;
 num_attr++;
 while (d_s)
   {
     for (i=0; i<num_attr; i++)
            printf("%d ", d_s->data[i]);
     printf("\n");
     d_s = d_s->next;
   }
} void print_table(table)
    Index_Table *table;
{
 while(table)
   {
     printf("class name : %s, class number = %d \n", table->class_name, table->class);
     table = table->next;
   }} void print_feature_groups(f_g)
    Feature_Group *f_g;
{
 Index_Table *t_ptr;
 while(f_g)
   {
     t_ptr = f_g->group_index_table;
     while (t_ptr)
            {
              printf("feature name : %s, class = %d \n", t_ptr->class_name, t_ptr->class);
              t_ptr = t_ptr->next;
            }
     printf("\n");
     f_g = f_g->next;
   }} int get_num_classes(ot)
    Index_Table *ot;
{
 int i=0;
 while (ot)
   {
     i++;
```

```c
      ot = ot->next;
    }
  return (i);
} void determine_num_unique_groups(current_group)
    Feature_Group *current_group;
{
  while (current_group)
    {
      current_group->num_unique_feats = get_num_classes(current_group->group_index_table);
      current_group = current_group->next;
    }
} void print_str_act_wts(f_g, num_attr, num_o_c)
    Feature_Group *f_g;
    int num_attr, num_o_c;
{
  int i, j;
  float tot;
  while(f_g)
    {
      for (i=0; i<f_g->num_unique_feats; i++)
          {
              tot = f_g->element_list[i].total_number_of_occurance;
              for (j=0; j<num_o_c; j++)
                {
                   printf("strength of activation associated with %s for class %d = %5.2f \n",
                          find_entry(f_g->group_index_table, i), j, (f_g->element_list[i].class_member_ship[j]/tot));

}
              printf("\n");
          }
      f_g = f_g->next;
      printf("\n");
    }
} void print_atten_wts(feat_group, num_out_classes)
    Feature_Group *feat_group;
    int num_out_classes;
{
  int i,j, counter=0;
  Feature_Group *f_g = feat_group;
  Feature_Node *element;
  float temp;

while(f_g)
    {
      for (i=0; i<num_out_classes; i++)
          {
              temp = 1.0 / f_g->attention_wts[i];
              printf("attention wts = %5.2f %d \n", temp, f_g->attention_wts[i]);
          }
      f_g = f_g->next;
    }
} void print_conj_atten_wts(conj_feat_group, num_out_classes)
    Conjunction_Feature_Group *conj_feat_group;
    int num_out_classes;
{
  int i,j, counter=0;
  Conjunction_Feature_Group *c_f_g = conj_feat_group;
  Feature_Node *element;
  float temp;

printf("Printting the conjunction attention weights \n");
```

```c
while(c_f_g)
  {
    for (i=0; i<num_out_classes; i++)
        {
            temp = 1.0 / c_f_g->attention_wts[i];
            printf("attention wts = %5.2f %d \n", temp, c_f_g->attention_wts[i]);
        }
    c_f_g = c_f_g->next;
  }
}

/* Given n numbers this will generate a unique id associated with the numbers. */
/* this is used for the concept conjunction code.                              */
int code_numbers(int_arr, num_elem)
int *int_arr, num_elem;
{
 double x = 10.0;
 int i, sum=0,j=num_elem-1;
 for (i=0; i<num_elem; i++)
   {
     sum += (int) int_arr[i] * pow(x, (double) j);
     j--;
   }
 return(sum);
}

Feature_Node *create_new_feat_element(feat_id, num_out_classes, out_class)
    int feat_id,num_out_classes;
{

Feature_Node *f_n;
 int j;
 f_n = (Feature_Node *) malloc (sizeof(Feature_Node));
 f_n->class_member_ship = (int *) calloc(num_out_classes, sizeof(int));
 f_n->total_number_of_occurance = 1;
 f_n->feature_id = feat_id;
 for (j=0; j<num_out_classes; j++)
   f_n->class_member_ship[j] = 0;
 f_n->class_member_ship[out_class]=1;
 f_n->next = NULL;
 return(f_n);
}

Feature_Node *find_element_conj(elem_ptr, feat_id)
    Feature_Node *elem_ptr;
    int feat_id;
{
 printf("the feat id = %d \n", feat_id);
 while (elem_ptr)
   {
     if (elem_ptr->feature_id == feat_id)
         return(elem_ptr);
     printf("\t In net feat_ids %d \n",elem_ptr->feature_id);
     elem_ptr = elem_ptr->next;
   }
 return(NULL);
}
```

```
;;; This program is designed to calculate the extent certain attributes affect the
;;; output. In this version the output is assumed to be the last attribute in
;;; the set entered.
;;; The lower and the upper sets are not being stored in this version of the program.

;;; Collect the values of the test attribuates.
(defun generateNset (universe)
  (prog (len)
        (setf len (length (car universe)))
        (setf Nset '())
        (dolist (g universe)
                (setf Nset (union Nset (list (nth (- len 1) g))))
                )
        (return Nset)))

;;; Generate the Qset. For now the Qset is the set of sets that
;;; have the same test attribute.
(Defun generateQset (universe Nset &aux Qset)
  (prog (len_set qmax tempset)
        (setf Qset '())
        (setf len_set (- (length (car universe)) 1))  ;; length of one set
        (setf qmax (length universe))
        (dolist (nelem Nset)
                (setf tempset '())
                (dotimes (i qmax)
                         (if
                             (equal nelem (nth len_set (nth i universe)))
                             (setf tempset (append tempset (list i)))
                             ())
                         )
                (if (not (equal tempset '()))
                    (setf Qset (append Qset (list tempset)))
                    ())
                )
        (return Qset)))

;;; Generate the reduced set, the set of attribuates the user wishes
;;; to examine. This reduced set will be call Rset (reduced set).
(defun generateRset (universe pchoice)
  (prog (Rset templist)
        (setf Rset '())
        (dolist (uelem universe)
                (setf templist '())
                (dolist (attr pchoice)
                        (setf templist (append templist (list (nth attr uelem))
                                               )))
                (setf Rset (append Rset (list templist))))
        (return Rset)))

;;; Generate the Pset, a set of sets that have the exact same reduced
;;; set. Use Rset. The do loop format:
;;; (do ((count 0 (+ count 1)))
;;;     ((equal count 10) count) (format t "~a ~%" count))
(defun generatePset (Rset &aux qmax reclist Pset templist)
  (setf qmax (length Rset))
  (setf reclist '())
  (setf Pset '())
  (dotimes (i qmax)
           (setf templist '())
           (cond
             ((not (member i reclist))
              (setf reclist (append reclist (list i)))
              (setf elem (nth i Rset))
              (setf templist (list i))
              (do ((count (+ i 1) (+ count 1)))
                  ((equal count qmax))
                  (cond
                    ((equal (nth count Rset) elem)
                     (setf templist (append templist (list count)))
```

```
                    (setf reclist (append reclist (list count))))))
            (setf Pset (append Pset (list templist))))))
  (value Pset))

;;; check to see if aset is a subset of bset. If it is then return true else `
;;; return the empty set.
(defun subset (aset bset)
 (cond
  ((equal aset (intersection aset bset))
   (value t))
  (t
   (value '()))))

;;; Get the lower set from the Pset and the Qset. Check every set in the Pset to see if
;;; it is a subset of any of the sets in the Qset if it is then add it to the lower set.
(defun LowerSet (Pset Qset)
 (setf lset '())
 (dolist (p Pset)
         (setf lset (append lset (dolist (q Qset)
                                         (cond
                                          ((equal t (subset p q))
                                           (return p))))))))
 (value lset))

;;; Get the upper set from the PSet and the Qset. Check every set in the Pset to see if
;;; it's intersection with any of the sets in Qset is nonempty if the condition is true
;;; then add it to the Upper set.
(defun UpperSet (Pset Qset)
 (setf uset '())
 (dolist (p Pset)
         (setf uset (append uset (dolist (q Qset)
                                         (cond
                                          ((not (equal '() (intersection p q)))
                                           (return p))))))))
 (value uset))

;;; Calculate the dependency. dependency = lower set / upper set.
(defun dependency (lset uset &aux res)
 (cond
  ((> (length uset) 0)
    (setf res (/ (length lset) (length uset))))
  (t
   (setf res 0)))
 (value res)
)

;;; Read the input from the input file. The file has the following format:
;;; - Number of rows to examine
;;; - Number of attributes in each row including output
;;; - The rows
(defun read_in(&aux nm filename input-stream num-rows num-attributes temp-str universe temp)
 (format t "Enter the name of the input file :")
 (setf nm (format nil "~s" (read)))
 (setf filename (concatenate 'string "~/rough_sets/" (string-downcase nm)))
 (setq input-stream (open filename :direction :input))
 (setf num-rows (read input-stream))
 (format t "num_rows = ~a ~%" num-rows)
 (setf num-attributes (read input-stream))
 (format t "num_attr = ~a ~%" num-attributes)
 (setf temp-str (loop as j from 1 to num-attributes
                        append
                        (list (read input-stream))))
 (format t "~a ~%" temp-str)
 (setf universe (loop as i from 1 to num-rows
                       append
                       (list
                        (setf temp (loop as j from 1 to num-attributes
                                         append
```

```lisp
                                    (list (read input-stream)))))))
  (close input-stream)
  (value (append (list universe) (list temp-str)))
)

(defun createset(universe choice &aux u lower upper)
  (setf u '())
  (setf lower (- (car choice) 1))
  (setf upper (cadr choice))
  (do ((i lower (+ i 1)))
      ((equal i upper))
    (setf u (append u (list (nth i universe)))))
  (value u))

;;; Create a combination of all possible sets from set.
(defun comb (set)
  (cond
    ((equal set '())
     (value '(())))
    (t
     (value (append (mapcar #'(lambda (x)
                                (append x (list (car set)))) (comb (cdr set))) (comb (cdr set)))))))

(defun start_comb (set &aux combset)
  (setf combset (comb set))
  (value (delete '() combset)))

(defun run (&aux n q u choice cf cfv p r temp-str tot-list len temp-elem sub-len)
  (setf q '())
  (setf tot-list (read_in))
  (setf u (nth 0 tot-list))
  (setf temp-str (nth 1 tot-list))
  (setf len (- (length temp-str) 1))
  (format t "Enter the size of the largest allowable set, the size of the set is ~a :" len)
  (setq sub-len (read-from-string (format nil "~s" (read))))
  (setf temp-elem (nth len temp-str))
  (format t "~a ~%" u)
  (setf limit (length (car u)))
  (setf list-attr '())
  (dotimes (i (- limit 1))
           (setf list-attr (cons i list-attr)))
  (format t "The number of input attributes is equal to ~d ~%" (- limit 1))
  (setf pchoice-sets (start_comb list-attr))
  (format t "The number of different combinations of possible attribuates is equal to ~d ~%" (length pchoice-sets))
  (format t "The sets are ~a ~%" pchoice-sets)
  (setf cf '())
  (dolist (pchoice pchoice-sets)
          (setf n (generateNset u))
          (setf q (generateQset u n))
          (setf r (generateRset u pchoice))
          (setf p (generatePset r))
          (setf lset (LowerSet p q))
          (setf uset (UpperSet p q))
          (setf depen (dependency lset uset))
          (if (<= (length pchoice) sub-len)
              (setf cf (append cf (list (cons depen (list pchoice))))))
          )
          )
  (format t "THE OUTPUT, (Certainty Factor, Attributes List) ~%")
  (format t "~a ~%" temp-str)
  (setf cf (sort cf #'> :key #'car))
  (dolist (cfv cf)
          (format t "~a ~%" cfv)
          (setf temp-list (nth 1 cfv))
          (format t "~5,2f " (nth 0 cfv))
          (dolist (elem-num temp-list)
                  (format t "~a " (string-downcase(nth elem-num temp-str))))
          (format t "in reference to ~a~% ~%" temp-elem))
```

What is claimed is:

1. A computer aided design system for determining a process design of machining a part based on given features including geometric features, wherein the system comprises:

an Episodal Associative Memory (EAM) which includes means including a genetic algorithm for self-organizing designs;

a cognitive memory;

means for producing a model of said part which includes a Feature-Based Design Environment (FBDE) for creating, manipulating, and editing a model of the part based on said given features;

means for determining a setup sequence using said EAM, means for automatically generating a fixture configuration for each setup;

means for automatically generating a feature sequence which depends on the setup sequence using said EAM;

means for determining an operation sequence using said EAM;

wherein the cognitive memory includes means for modifying one or more of the setup sequence, the feature sequence, and operation sequence, including means for comparing previously provided and updated sequences to update weights of the cognitive memory, the resultant process being stored and clustered in the cognitive memory for future retrieval;

means for concept generation to identify new knowledge regarding the process design.

2. A computer aided design system according to claim 1, wherein the means for concept generation includes means for obtaining rules about relationships among design attributes and objects, using "rough sets", and means for generating rules from the "rough sets" to form relationships which are fed back to the cognitive memory as new knowledge, whereby inductive-deductive coupling is completed.

3. A method using a computer aided design system for determining a process design of machining a part based on given features including geometric features, wherein the system includes an Episodal Associative Memory (EAM) having means including a genetic algorithm for self-oranizing designs, and a cognitive memory; wherein said method comprises the steps:

producing a model of said part which includes a Feature-Based Design Environment (FBDE) for creating, manipulating, and editing a model of the part based on said given features;

determining a setup sequence using said EAM, automatically generating a fixture configuration for each setup;

automatically generating a feature sequence which depends on the setup sequence using said EAM;

determining an operation sequence using said EAM;

using the cognitive memory for modifying one or more of the setup sequence, the feature sequence, and operation sequence, including comparing previously provided and updated sequences to update weights of the cognitive memory, the resultant process being stored and clustered in the cognitive memory for future retrieval; and using a concept generation to identify new knowledge regarding the process design.

4. A computer aided design system for determining a process design based on a given set of features involving competing geometric, function, process and material constraints to be optimized across one or more discrete manufacturing steps and multi-step thin film material growth, wherein the system comprises:

an Episodal Associative Memory (EAM) which includes means including a genetic algorithm for self-organizing designs;

a cognitive memory;

means for producing a model of said part which includes a Feature-Based Design Environment (FBDE) for creating, manipulating, and editing a model of the part based on said given features;

means for determining a setup sequence using said EAM, means for automatically generating a fixture configuration for each setup;

means for automatically generating a feature sequence which depends on the setup sequence using said EAM;

means for determining an operation sequence using said EAM;

wherein the cognitive memory includes means for modifying one or more of the setup sequence, the feature sequence, and, including a means for comparing previously provided and updated sequences to modify weights of the cognitive memory, the resultant process being stored and clustered in the cognitive memory for future retrieval; and means for concept generation to identify new knowledge regarding the process design.

5. A computer aided design system according to claim 4, wherein the means for concept generation includes means for obtaining rules about relationships among design attributes and objects, using "rough sets", and means for generating rules from the "rough sets" to form relationships which are fed back to the cognitive memory as new knowledge, whereby inductive-deductive coupling is completed.

6. A computer aided design system for determining a process design of machining a part based on given features including geometric features, wherein the system comprises:

an Episodal Associative Memory (EAM) which includes means including an unsupervised neural network for self-organizing designs;

a cognitive memory;

means for producing a model of said part which includes a Feature-Based Design Environment (FBDE) for creating, manipulating, and editing a model of the part based on said given features;

means for determining a setup sequence using said EAM, means for automatically generating a fixture configuration for each setup;

means for automatically generating a feature sequence which depends on the setup sequence using said EAM;

means for determining an operation sequence using said EAM;

wherein the cognitive memory includes means for modifying one or more of the setup sequence, the feature sequence, and operation sequence, including means for comparing previously provided and updated sequences to update weights of the cognitive memory, the resultant process being stored and clustered in the cognitive memory for future retrieval;

means for concept generation to identify new knowledge regarding the process design.

\* \* \* \* \*